(12) United States Patent
Kuekes et al.

(10) Patent No.: US 7,489,583 B2
(45) Date of Patent: *Feb. 10, 2009

(54) CONSTANT-WEIGHT-CODE-BASED ADDRESSING OF NANOSCALE AND MIXED MICROSCALE/NANOSCALE ARRAYS

(75) Inventors: Philip J. Kuekes, Menlo Park, CA (US); J. Warren Roblnett, Pittsboro, NC (US); Ron M. Roth, Haifa (IL); Gadiel Seroussl, Cupertino, CA (US); Gregory S. Smider, Mountain View, CA (US); R. Stanley Williams, Portola, CA (US)

(73) Assignee: Hewlett-Packard Development Company, L.P.

( * ) Notice: Subject to any disclaimer, the term of this patent is extended or adjusted under 35 U.S.C. 154(b) by 542 days.

This patent is subject to a terminal disclaimer.

(21) Appl. No.: 11/221,036

(22) Filed: Sep. 6, 2005

(65) Prior Publication Data

US 2007/0053378 A1 Mar. 8, 2007

(51) Int. Cl.
*G11C 8/00* (2006.01)

(52) U.S. Cl. ............. 365/230.02; 365/239; 365/230.06; 365/230.09; 365/231; 341/96; 714/758; 711/218

(58) Field of Classification Search ............ 365/230.02, 365/239, 230.06, 230.09, 231
See application file for complete search history.

(56) References Cited

U.S. PATENT DOCUMENTS

| | | | |
|---|---|---|---|
| 4,556,960 A * | 12/1985 | Cohn et al. .................. | 711/218 |
| 6,128,214 A | 10/2000 | Kuekes et al. | |
| 6,466,512 B1 * | 10/2002 | Hogan et al. ................ | 365/239 |
| 6,570,795 B1 * | 5/2003 | Fricke et al. ................ | 365/200 |
| 7,073,157 B2 * | 7/2006 | DeHon et al. ................ | 716/17 |
| 7,191,380 B2 * | 3/2007 | Kuekes et al. ............... | 714/758 |
| 7,319,416 B2 * | 1/2008 | Robinett et al. ............... | 341/96 |

(Continued)

FOREIGN PATENT DOCUMENTS

JP 02003178595 A * 6/2003

OTHER PUBLICATIONS

Philip J Kuekes et al—"Improved Voltage Margins Using Linear Error-Correcting Codes in Resistor-Logic Demultiplexers for Nanoelectronics"—Nanotechnology—vol. 16 No. 9 Sep. 1, 2005.

(Continued)

*Primary Examiner*—Viet Q Nguyen

(57) ABSTRACT

Various embodiments of the present invention include methods for determining nanowire addressing schemes and include microscale/nanoscale electronic devices that incorporate the nanowire addressing schemes for reliably addressing nanowire-junctions within nanowire crossbars. The addressing schemes allow for change in the resistance state, or other physical or electronic state, of a selected nanowire-crossbar junction without changing the resistance state, or other physical or electronic state, of the remaining nanowire-crossbar junctions, and without destruction of either the selected nanowire-crossbar junction or the remaining, non-selected nanowire-crossbar junctions. Additional embodiments of the present invention include nanoscale memory arrays and other nanoscale electronic devices that incorporate the nanowire-addressing-scheme embodiments of the present invention. Certain of the embodiments of the present invention employ constant-weight codes, a well-known class of error-control-encoding codes, as addressed-nanowire selection voltages applied to microscale output signal lines of microscale/nanoscale encoder-demultiplexers that are selectively interconnected with a set of nanowires.

23 Claims, 33 Drawing Sheets

U.S. PATENT DOCUMENTS

| | | | |
|---|---|---|---|
| 7,350,132 B2 * | 3/2008 | Kuekes et al. | 714/758 |
| 2005/0055387 A1 | 3/2005 | Kuekes et al. | |
| 2008/0013393 A1 * | 1/2008 | Robinett et al. | 365/225.7 |

OTHER PUBLICATIONS

P J Kuekes et al—"Defect-Tolerant Demultiplexers for Nano-Electronics Constructed From Err-Correcting Codes"—Applied Physics A vol. A80 No. 6 Mar. 2005—pp. 1161-1164.

P J Kuekes et al—"Resistor-Logic Demultiplexers for Nanelectronics Based on Constant-Weight Codes"—Nanotechnology vol. 17 No. 4 Feb. 28, 2008—pp. 1052-1061.

P J Kuekes et al—"Effect of Conductance Variability on Resistor-Logic Demultiplexers for Nanoelectronics"—IEEE Transactions on Nanotechnology vol. 5 No. 5 Sep. 2006—pp. 446-454.

Chen Yong et al—"Nanoscale Molecular-Switch Crossbar Circuits"—Nanotechnology—vol. 14 No. 4 Apr. 1, 2003—pp. 462-468.

Yong Chen et al—"Nanoscale Molecular-Switch Devices Fabricated by Imprint Lithography"—Applied Physics Letters—vol. 82 No. 10 Mar. 10, 2003—pp. 1610-1612.

Helgert, H., et al., "Minimum-distance bounds for binary linear codes," IEEE, vol. 19, Issue: 3, Publication Date: May 1973, pp. 344-356.

Dehon, Andre, "Array-Based Architecture for FET-Based, Nanoscale Electronics," IEEE, vol. 2, No. 1, pp. 23-32, Mar. 2003.

Snider, G., "Computing with hysteretic resistor crossbars," Applied Physics A: Materials Science & Processing, vol. 80, No. 6, pp. 1165-1172, Mar. 2005.

Snider, G., et al., "Nanoelectronic architectures," Applied Physics A: Materials Science & Processing, vol. 80, No. 6, pp. 1183-1195, Mar. 2005.

Snider, G.S., et al., "Crossbar demultiplexers for nanoelectronics based on n-hot codes," IEEE, vol. 4, Issue 2, pp. 249-254, Mar. 2005.

Kuekes, Philip J., et al., "Defect-tolerant interconnect to nanoelectonic circuits: internally redundant demultiplexers based on error-correcting codes," Institute of Physics, Apr. 19, 2005.

* cited by examiner

|  n  |  k  |
|---|---|
| 0 1 1 0 0 0 0 0 1 0 0 0 1 1 1 0 | 0 0 0 0 0 0 0 0 |
| 0 1 0 1 0 0 0 0 1 1 0 0 0 1 1 0 | 0 0 0 0 0 0 0 1 |
| 1 1 0 0 0 0 1 1 0 0 1 0 0 0 1 0 | 0 0 0 0 0 0 1 1 |
| 1 0 1 0 0 1 0 0 1 1 0 1 0 0 0 0 | 0 0 0 0 0 1 0 0 |
| $u_4$ | $a_4$ |
| $u_5$ | $a_5$ |
| $u_6$ | $a_6$ |
| $u_7$ | $a_7$ |
| $u_8$ | $a_8$ |
| $u_9$ | $a_9$ |
| $u_{10}$ | $a_{10}$ |
| $u_{11}$ | $a_{11}$ |
| $u_{12}$ | $a_{12}$ |
| $u_{13}$ | $a_{13}$ |
| $u_{14}$ | $a_{14}$ |
| $u_{15}$ | $a_{15}$ |
| $u_{m-14}$ | $a_{m-14}$ |
| $u_{m-13}$ | $a_{m-13}$ |
| $u_{m-12}$ | $a_{m-12}$ |
| $u_{m-11}$ | $a_{m-11}$ |
| $u_{m-10}$ | $a_{m-10}$ |
| $u_{m-9}$ | $a_{m-9}$ |
| $u_{m-8}$ | $a_{m-8}$ |
| $u_{m-7}$ | $a_{m-7}$ |
| $u_{m-6}$ | $a_{m-6}$ |
| $u_{m-5}$ | $a_{m-5}$ |
| $u_{m-4}$ | $a_{m-4}$ |
| $u_{m-3}$ | $a_{m-3}$ |
| $u_{m-2}$ | $a_{m-2}$ |
| $u_{m-1}$ | $a_{m-1}$ |

*Figure 7*

$$W(v_i) = \sum_{i=0}^{n-1} v_i$$

$$W(v_f) = W\left(\boxed{0\,1\,1\,0\,1\,0\,0\,0\,1\,0\,1\,1}\right) = 6$$

$v_f$ ⏐ 1102

$$W(v_f) = d_{v_f, v_o} = v_f \oplus v_o = 6$$

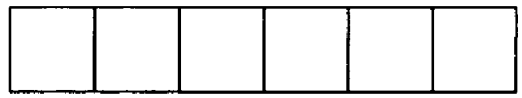
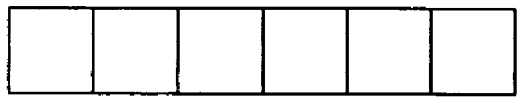
Figure 20

| u | h | $d_{u-h}$ |
|---|---|---|
| $S_{00}$ | $S_{00}$ | 0 |
| $S_{00}$ | $S_{01}$ | 4 |
| $S_{00}$ | $S_{10}$ | 4 |
| $S_{00}$ | $S_{11}$ | 4 |
| $S_{01}$ | $S_{10}$ | 4 |
| $S_{01}$ | $S_{11}$ | 4 |
| $S_{10}$ | $S_{11}$ | 4 |

— 2102

— 2104

$$\begin{pmatrix} \\ \\ \end{pmatrix}_v = \begin{pmatrix} 1 \\ 1 \end{pmatrix}_1 - \begin{pmatrix} 0 \\ 4 \end{pmatrix}_d \cdot \frac{1}{6}$$

$$\begin{pmatrix} \\ \\ \end{pmatrix}_v = \begin{pmatrix} 1 \\ 1 \end{pmatrix} - \begin{pmatrix} 0 \\ \frac{2}{3} \end{pmatrix}$$

$$\begin{pmatrix} \\ \\ \end{pmatrix}_v = \begin{pmatrix} 1 \\ \frac{1}{3} \end{pmatrix} \quad \text{— 2106}$$

*Figure 21*

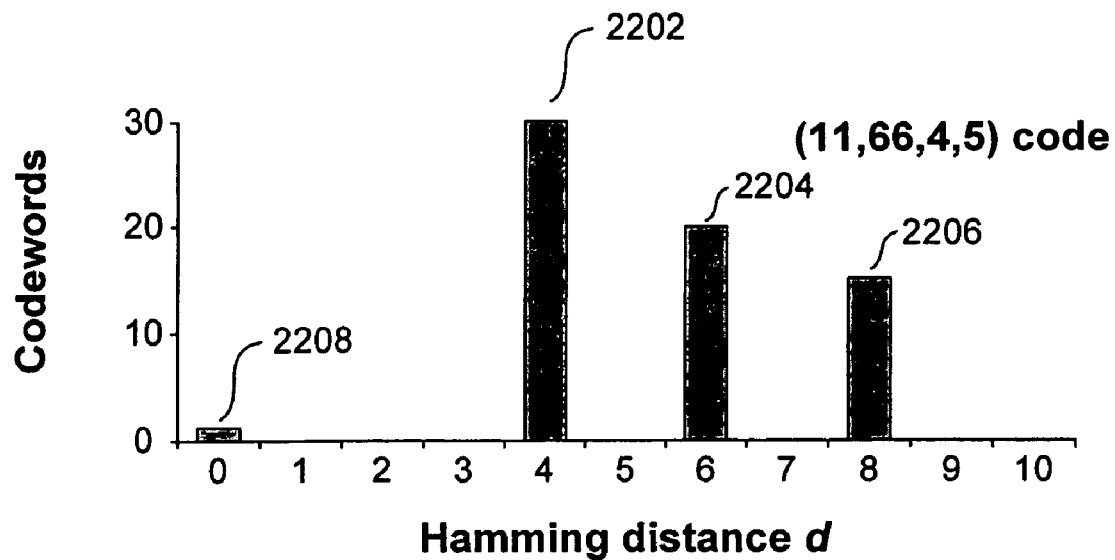
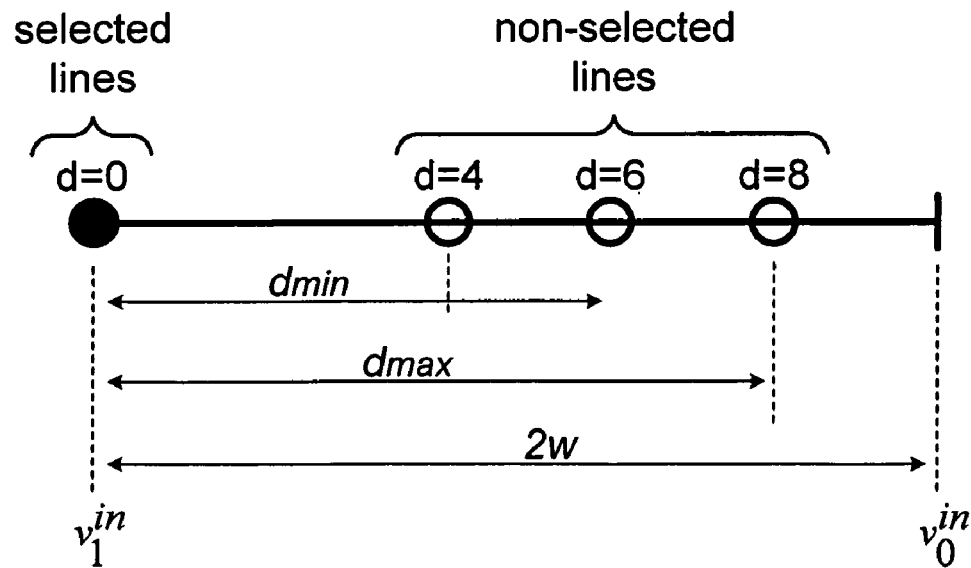
*Figure 22*

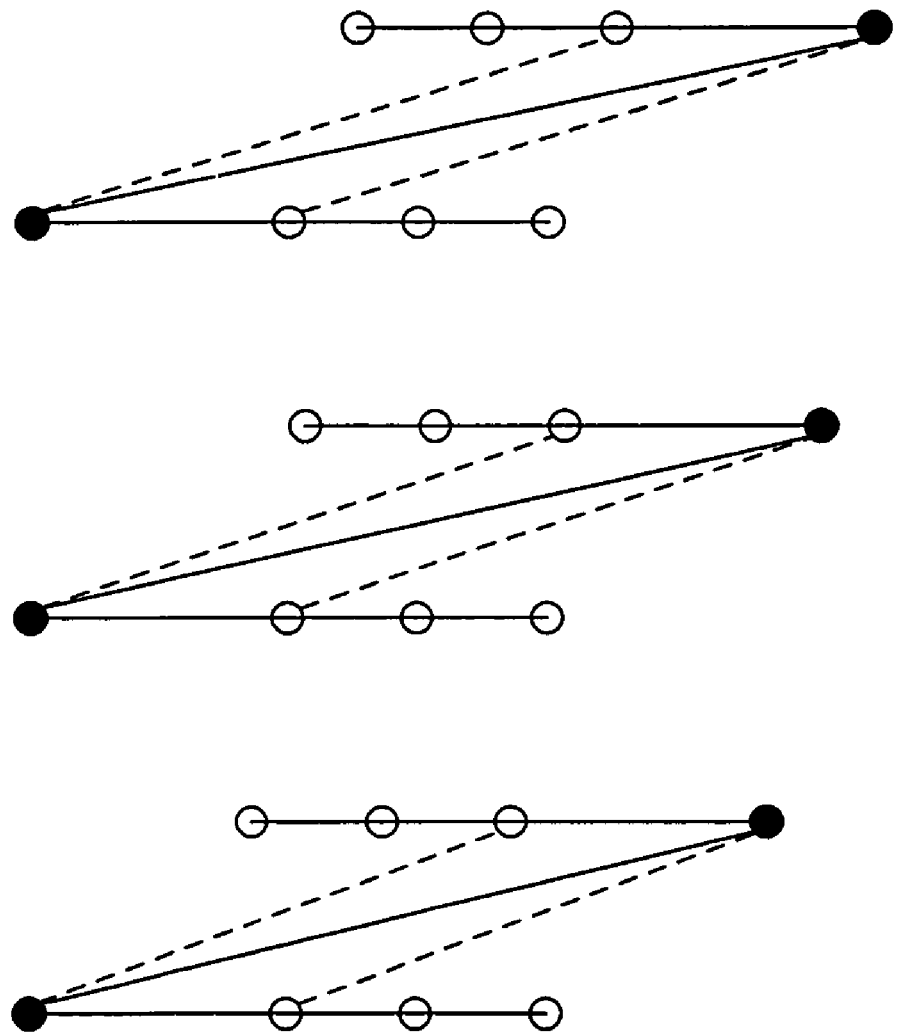

CONSTANT-WEIGHT-CODE-BASED ADDRESSING OF NANOSCALE AND MIXED MICROSCALE/NANOSCALE ARRAYS

STATEMENT OF GOVERNMENT INTEREST

This invention has been made with Government support under grant number MDA972-01-3-0005, awarded by the DARPA. The government has certain rights in the invention.

TECHNICAL FIELD

The present invention is related to nanoscale and mixed microscale/nanoscale electronics and, in particular, to efficient addressing schemes for encoder-demultiplexers that address a nanoscale memory array and to nanoscale and mixed microscale/nanoscale electronic devices that incorporate the efficient addressing schemes.

BACKGROUND OF THE INVENTION

Significant research and development efforts are currently directed towards designing and manufacturing nanoscale electronic devices, including nanoscale memories. Nanoscale electronics promise a number of advantages over microscale, photolithography-based electronics, including significantly reduced features sizes and the potential for self-assembly and for other relatively inexpensive, non-photolithography-based fabrication methods. However, the design and manufacture of nanoscale electronic devices present many new problems that need to be addressed prior to large-scale commercial production of nanoscale electronic devices and incorporation of nanoscale electronic devices into microscale and larger-scale systems, devices, and products.

Nanoscale memory arrays are possible candidates for relatively near-term commercialization. Nanoscale memories can be fabricated as nanowire crossbars with hysteretic-resistors nanowire-crossbar junctions. Relatively large voltages can be applied to a given nanowire-crossbar junction to reversibly configure the given nanowire-crossbar junction in a high-resistance state or low-resistance state, the particular resistance state obtained depending on the polarity of the applied voltage. Relatively lower voltages can be applied to a given nanowire-crossbar junction to read the resistance state of the given nanowire-crossbar junction without changing the resistance state. However, application of voltages even greater in magnitude than the voltages used to reversibly configure nanowire-crossbar junctions can irreversibly destroy the nanowire-crossbar junctions to which the greater voltages are applied. Each nanowire-crossbar junction serves as a single-bit memory element, storing a binary value "0" or "1" as a high-resistance or low-resistance state, respectively. It is difficult, however, to directly access the nanowires from which nanoscale array memories are constructed using convention microelectronic signal lines and logic. Instead, the nanowires are addressed through selective interconnections to microscale output signal lines of mixed microscale/nanoscale encoder-demultiplexers. A nanowire address input to an encoder-demultiplexer via microscale address lines is transformed into a pattern of addressed-nanowire selection voltages output by the encoder to microscale output signal lines of the encoder-demultiplexer. Selection of the two nanowires that cross at a particular nanowire-crossbar junction by two encoder-demultiplexers results in applying a defined voltage to the nanowire-crossbar junction selected by input of two nanowire addresses to the two encoder-demultiplexers. Because of the need to apply a WRITE-access voltage of a magnitude in a voltage-magnitude range between a minimum resistance-state-changing threshold voltage and a junction-destroying threshold voltage to the selected nanowire-crossbar junction, while applying voltages of magnitudes less than minimum resistance-state-changing threshold voltage to all other, non-selected nanowire-crossbar junctions in order to change the information content of the selected nanowire-junction, the addressed-nanowire selection voltages output by the encoder-demultiplexers need to result in large separation between the voltage applied to a selected nanowire-crossbar junction and voltages applied to all other, non-selected nanowire-crossbar junctions or, in other words, to reasonably large voltage margins for WRITE-access operations. For this reason, designers and manufacturers of nanoscale memory arrays have recognized the need for finding effective nanowire addressing schemes, and for building encoder-demultiplexers based on these addressing schemes, in order to provide sufficient voltage margins for reliably accessing individual junctions within a nanowire crossbar.

SUMMARY OF THE INVENTION

Various embodiments of the present invention include methods for determining nanowire addressing schemes and include microscale/nanoscale electronic devices that incorporate the nanowire addressing schemes for reliably addressing nanowire-junctions within nanowire crossbars. The addressing schemes need to result in application of greater-than-WRITE-threshold voltages to selected nanowire-crossbar junctions without applying WRITE-threshold voltages to any non-selected nanowire-crossbar junctions, and without applying greater-than-destruction-threshold voltages to any nanowire-crossbar junction within the nanowire crossbar. This allows for change in the resistance state, or other physical or electronic state, of a selected nanowire-crossbar junction without changing the resistance state, or other physical or electronic state, of the remaining nanowire-crossbar junctions, and without destruction of either the selected nanowire-crossbar junction or the remaining, non-selected nanowire-crossbar junctions. Additional embodiments of the present invention include nanoscale memory arrays and other nanoscale electronic devices that incorporate the nanowire-addressing-scheme embodiments of the present invention. Certain of the embodiments of the present invention employ constant-weight codes, a well-known class of error-control-encoding codes, as addressed-nanowire selection voltages applied to microscale output signal lines of microscale/nanoscale encoder-demultiplexers that are selectively interconnected with a set of nanowires. Constant-weight codes provide the best voltage margins for a given number of encoder-demultiplexer output signal lines.

BRIEF DESCRIPTION OF THE DRAWINGS

FIG. 7 shows a table representing a constant-weight error-control-encoding code.

FIG. 11 illustrates determination of the weight of a code word.

FIG. 20 graphically illustrates a vector equation for determining a possible-output-voltages vector v.

FIG. 21 illustrates deriving the possible-output-voltages vector v from the constant-weight code employed in the exemplary encoder-demultiplexer of FIGS. 13 and 16A-D.

FIG. 22 shows the distance profile of an (11,66,4,5) constant-weight code.

FIGS. 25A-D illustrate determination of an optimal voltage offset t for paired, constant-weight-code-based encoder-demultiplexers.

DETAILED DESCRIPTION OF THE INVENTION

Figure 1:
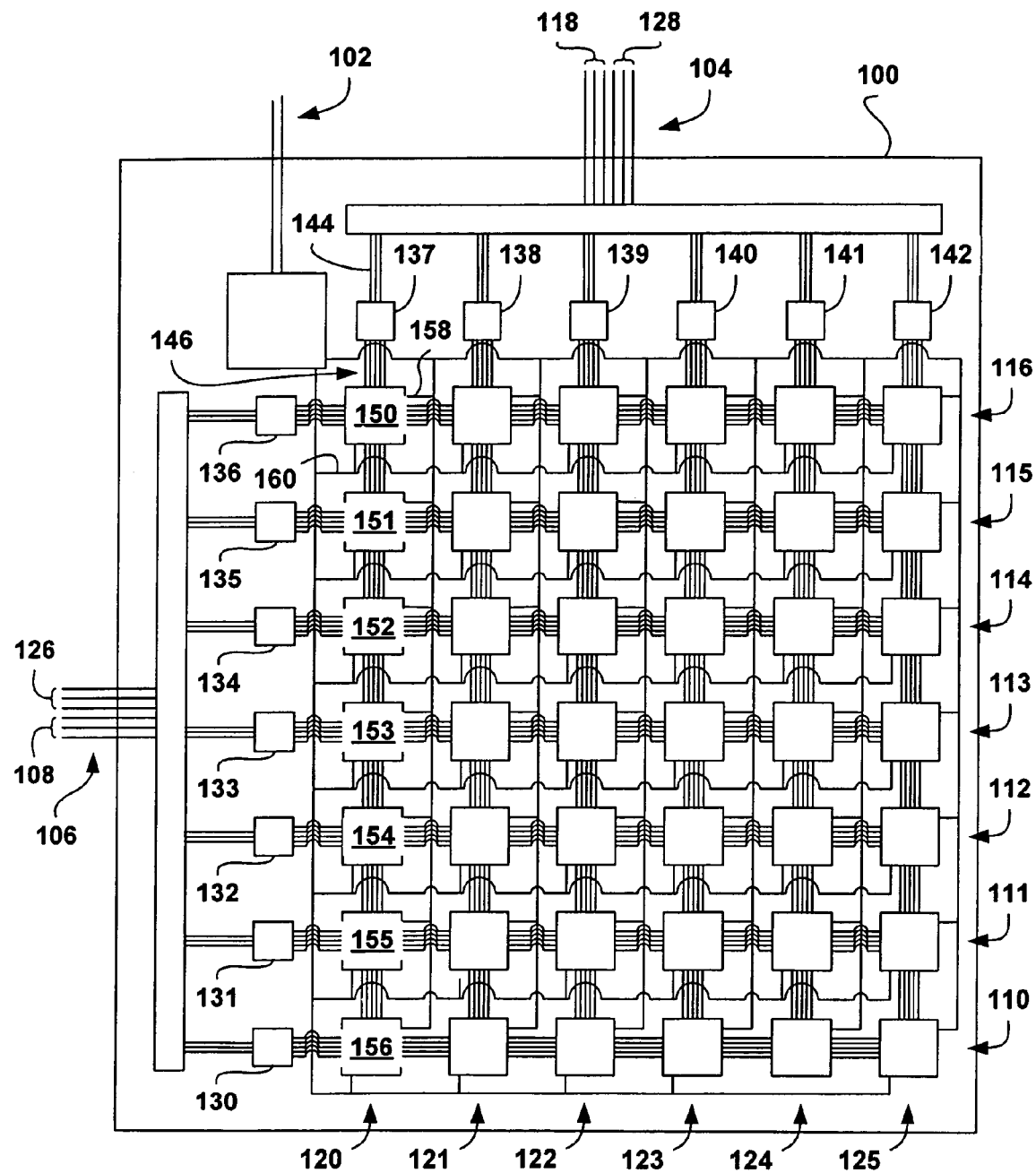
FIG. 1 shows a diagram of a combined nanoscale/microscale electronic memory device.

The present invention concerns design of nanowire addressing schemes, design of nanowire-crossbar-based nanoscale electronic devices, including nanoscale memory arrays, and the design of microscale/nanoscale encoder-demultiplexers used for addressing nanowire crossbars. The present invention is therefore interdisciplinary in nature, and a basic understanding of error-control encoding, nanowire crossbars, and properties and characteristics of nanoscale hysteretic resistors greatly facilitates understanding descriptions of various embodiments of the present invention. In a first subsection, below, an overview of error-control coding is provided. In a second subsection, an overview of nanoscale memory arrays and methods for addressing nanoscale memory arrays is provided. In a third subsection, characteristics and properties of hysteretic resistors are described. In a fourth subsection, constant-weight codes, employed in various embodiments of the present invention, are described. Finally, in the final subsection, method and device embodiments of the present invention are discussed.

Mathematical Description of Selected Error-Control Encoding Techniques

Embodiments of the present invention employ concepts derived from well-known techniques in error-control encoding. This subsection provides background information on error-correcting codes, and may be skipped by those familiar with these topics. An excellent reference for this field is the textbook "Error Control Coding: The Fundamentals and Applications," Lin and Costello, Prentice-Hall, Incorporated, New Jersey, 1983. In this subsection, a brief description of the error-detection and error-correction techniques used in error-control encoding are described. Additional details can be obtained from the above-referenced textbook, or from many other textbooks, papers, and journal articles in this field. The current subsection represents a rather mathematically precise, but concise, description of certain types of error-control encoding techniques. The current invention employs concepts inherent in these error-control encoding techniques for a different purpose.

Error-control encoding techniques systematically introduce supplemental bits or symbols into plain-text messages, or encode plain-text messages using a greater number of bits or symbols than absolutely required, in order to provide information in encoded messages to allow for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords. The current invention employs concepts used in error-control coding to add supplemental address signal lines to increase the distance between valid addresses in order to correspondingly increase the signal separation, e.g. voltage or current, between ON and OFF states of address signal lines and to provide defective-junction tolerance in interface interconnections. Thus, in the current invention, the plain-text and encoded messages of error-control encoding are analogous to input addresses and coded addresses, and the additional or greater-number-than-needed symbols or bits in error-control encoding are analogous to supplemental or a greater-than-absolutely-needed number of address signal lines.

In describing error detection and correction, it is useful to describe the data to be transmitted, stored, and retrieved as one or more messages, where a message μ comprises an ordered sequence of symbols, $\mu_i$, that are elements of a field F. A message μ can be expressed as:

$$\mu = (\mu_0, \mu_1, \ldots \mu_{k-1})$$

where $\mu_i \in F$.

The field F is a set that is closed under multiplication and addition, and that includes multiplicative and additive inverses. It is common, in computational error detection and correction, to employ fields comprising a subset of integers with sizes equal to a prime number, with the addition and multiplication operators defined as modulo addition and modulo multiplication. In practice, the binary field is commonly employed. Commonly, the original message is encoded into a message c that also comprises an ordered sequence of elements of the field F, expressed as follows:

$$c = (c_0, c_1, \ldots c_{n-1})$$

where $c_i \in F$.

Block encoding techniques encode data in blocks. In this discussion, a block can be viewed as a message μ comprising a fixed number of symbols k that is encoded into a message c comprising an ordered sequence of n symbols. The encoded message c generally contains a greater number of symbols than the original message μ, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

In a linear block code, the $2^k$ codewords form a k-dimensional subspace of the vector space of all n-tuples over the field F. The Hamming weight of a codeword is the number of non-zero elements in the codeword, and the Hamming distance between two codewords is the number of elements in which the two codewords differ. For example, consider the following two codewords a and b, assuming elements from the binary field:

$$a = (1\ 0\ 0\ 1\ 1)$$

$$b = (1\ 0\ 0\ 0\ 1)$$

The codeword a has a Hamming weight of 3, the codeword b has a Hamming weight of 2, and the Hamming distance between codewords a and b is 1, since codewords a and b differ only in the fourth element. Linear block codes are often designated by a three-element tuple [n, k, d], where n is the codeword length, k is the message length, or, equivalently, the base-2 logarithm of the number of codewords, and d is the minimum Hamming distance between different codewords, equal to the minimal-Hamming-weight, non-zero codeword in the code.

The encoding of data for transmission, storage, and retrieval, and subsequent decoding of the encoded data, can be notationally described as follows, when no errors arise during the transmission, storage, and retrieval of the data:

$$\mu \to c(s) \to c(r) \to \mu$$

where c(s) is the encoded message prior to transmission, and c(r) is the initially retrieved or received, message. Thus, an initial message μ is encoded to produce encoded message c(s) which is then transmitted, stored, or transmitted and stored, and is then subsequently retrieved or received as initially received message c(r). When not corrupted, the initially received message c(r) is then decoded to produce the original message μ. As indicated above, when no errors arise, the originally encoded message c(s) is equal to the initially received message c(r), and the initially received message c(r) is straightforwardly decoded, without error correction, to the original message μ.

When errors arise during the transmission, storage, or retrieval of an encoded message, message encoding and decoding can be expressed as follows:

$$\mu(s) \to c(s) \to c(r) \to \mu(r)$$

Thus, as stated above, the final message μ(r) may or may not be equal to the initial message μ(s), depending on the fidelity of the error detection and error correction techniques employed to encode the original message μ(s) and decode or reconstruct the initially received message c(r) to produce the final received message μ(r). Error detection is the process of determining that:

$$c(r) \neq c(s)$$

while error correction is a process that reconstructs the initial, encoded message from a corrupted initially received message:

$$c(r) \to c(s)$$

The encoding process is a process by which messages, symbolized as μ, are transformed into encoded messages c. Alternatively, a message μ can be considered to be a word comprising an ordered set of symbols from the alphabet consisting of elements of F, and the encoded messages c can be considered to be a codeword also comprising an ordered set of symbols from the alphabet of elements of F. A word μ can be any ordered combination of k symbols selected from the elements of F, while a codeword c is defined as an ordered sequence of n symbols selected from elements of F via the encoding process:

$$\{c: \mu \to c\}$$

Linear block encoding techniques encode words of length k by considering the word μ to be a vector in a k-dimensional vector space, and multiplying the vector μ by a generator matrix, as follows:

$$c = \mu \cdot G$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & & \ddots & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \cdot \\ \cdot \\ \cdot \\ g_{k-1} \end{pmatrix}$$

where $g_i = (g_{i,0}, g_{i,1}, g_{i,2} \cdots g_{i,n-1})$.

The generator matrix G for a linear block code can have the form:

$$G_{k,n} = \begin{pmatrix} p_{0,0} & p_{0,1} & \cdots & p_{0,r-1} & 1 & 0 & 0 & \cdots & 0 \\ p_{1,0} & p_{1,1} & \cdots & p_{1,r-1} & 0 & 1 & 0 & \cdots & 0 \\ \cdot & \cdot & \cdots & & 0 & 0 & 1 & \cdots & 0 \\ \cdot & \cdot & \cdots & & \cdot & \cdot & \cdot & \cdots & \cdot \\ \cdot & \cdot & \cdots & & \cdot & \cdot & \cdot & \cdots & \cdot \\ p_{k-1,0} & p_{k-1,1} & \cdots & p_{k-1,r-1} & 0 & 0 & 0 & \cdots & 1 \end{pmatrix}$$

or, alternatively:

$$G_{k,n} = [P_{k,r} | I_{k,k}].$$

Thus, the generator matrix G can be placed into a form of a matrix P augmented with a k by k identity matrix $I_{k,k}$. A code generated by a generator in this form is referred to as a "systematic code." When this generator matrix is applied to a word μ, the resulting codeword c has the form:

$$c = (c_0, c_1, \ldots, c_{r-1}, \mu_0, \mu_1, \ldots, \mu_{k-1})$$

where $c_i = \mu_0 p_{0,i} + \mu_1 p_{1,i}, \ldots, \mu_{k-1} p_{k-1,i}).$

Note that, in this discussion, a convention is employed in which the check symbols precede the message symbols. An alternate convention, in which the check symbols follow the message symbols, may also be used, with the parity-check and identity submatrices within the generator matrix interposed to generate codewords conforming to the alternate convention. Thus, in a systematic linear block code, the codewords comprise r parity-check symbols $c_i$ followed by the symbols comprising the original word μ. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix $H_{r,n}$, defined as:

$$H_{r,n} = [I_{r,r} | -P^T]$$

or, equivalently, $$H_{r,n} = \begin{pmatrix} 1 & 0 & 0 & \cdots & 0 & -p_{0,0} & -p_{1,0} & -p_{2,0} & \cdots & -p_{k-1,0} \\ 0 & 1 & 0 & \cdots & 0 & -p_{0,1} & -p_{1,1} & -p_{2,1} & \cdots & -p_{k-1,1} \\ 0 & 0 & 1 & \cdots & 0 & -p_{0,2} & -p_{1,2} & -p_{2,2} & \cdots & -p_{k-1,2} \\ \cdot & \cdot & \cdot & \cdots & \cdot & \cdot & \cdot & \cdot & \cdots & \cdot \\ 0 & 0 & 0 & \cdots & 1 & -p_{0,r-1} & -p_{1,r-1} & -p_{0,r-1} & \cdots & -p_{k-1,r-1} \end{pmatrix}.$$

The parity-check matrix can be used for systematic error detection and error correction. Error detection and correction involves computing a syndrome S from an initially received or retrieved message c(r) as follows:

$$S = (s_0, s_1, \ldots, s_{r-1}) = c(r) \cdot H^T$$

where $H^T$ is the transpose of the parity-check matrix $H_{r,n}$ expressed as:

$$H^T = \begin{pmatrix} 1 & 0 & 0 & \cdots & 0 \\ 0 & 1 & 0 & \cdots & 0 \\ 0 & 0 & 1 & \cdots & 0 \\ \cdot & \cdot & \cdot & \cdots & 1 \\ -p_{0,0} & -p_{0,1} & -p_{0,2} & \cdots & -p_{0,r-1} \\ -p_{1,0} & -p_{0,1} & -p_{0,2} & \cdots & -p_{0,r-1} \\ -p_{2,0} & -p_{0,1} & -p_{0,2} & \cdots & -p_{0,r-1} \\ \cdot & \cdot & \cdot & \cdots & \cdot \\ -p_{k-1,0} & -p_{k-1,1} & -p_{k-1,2} & \cdots & -p_{k-1,r-1} \end{pmatrix}$$

Note that, when a binary field is employed, x=−x, so the minus signs shown above in $H^T$ are generally not shown.

Hamming codes are linear codes created for error-correction purposes. For any positive integer m greater than or equal to 3, there exists a Hamming code having a codeword length n, a message length k, number of parity-check symbols r, and minimum Hamming distance $d_{min}$ as follows:

$$n = 2^m - 1$$

$$k = 2^m - m - 1$$

$$r = n - k = m$$

$$d_{min} = 3$$

The parity-check matrix H for a Hamming Code can be expressed as:

$$H = [I_m | Q]$$

where $I_m$ is an m×m identity matrix and the submatrix Q comprises all $2^m - m - 1$ distinct columns which are m-tuples each having 2 or more non-zero elements. For example, for m=3, a parity-check matrix for a [7,4,3] linear block Hamming code is $$H = \begin{pmatrix} 1 & 0 & 0 & 0 & 1 & 1 & 1 \\ 0 & 1 & 0 & 1 & 1 & 1 & 0 \\ 0 & 0 & 1 & 1 & 0 & 1 & 1 \end{pmatrix}$$

A generator matrix for a Hamming code is given by:

$$G = [Q^T I_{2^m - m - 1}]$$

where $Q^T$ is the transpose of the submartix Q, and $I_{2^m - m - 1}$ is a $(2^m - m - 1) \times (2^m - m - 1)$ identity matrix. By systematically deleting l columns from the parity-check matrix H, a parity-check matrix H' for a shortened Hamming code can generally be obtained, with:

$$n = 2^m - l - 1$$

$$k = 2^m - m - l - 1$$

$$r = n - k = m$$

$$d_{min} \geq 3$$

As will be discussed, below, one embodiment of the present invention involves employing the above-described error-control coding techniques to a very different problem space, in which, rather than generating codewords of length k+r from messages of length k, interconnections between k+r internal signal lines are generated from addresses input into k input signal lines. In other words, one embodiment of the present invention involves applying error-control coding techniques to addresses within an address space of up to size $2^k$ to generate interconnection mappings between address signal lines and up to $2^k$ signal lines addressed by the $2^k$ addresses.

Other types of codes are employed to increase the Hamming distance between codewords in various applications. Many of these alternative codes do not have the convenient properties of linear block codes, including easy generation using generator matrices, and the transparent, pass-through feature of linear block codes allowing for the encoded value to be directly read from the code word. For linear block codes, a plain-text message transfers directly to a codeword containing, in addition, parity-check symbols or bits. In other types of codes, the plain-text message is not directly readable in a corresponding codeword. In both cases, codewords contain a greater number of symbols or bits than absolutely needed to enumerate all valid messages to be encoded. In the case of linear block codes, the additional symbols or bits are parity-check symbols or bits that supplement the plain-text symbols or bits, while in the other types of codes, valid messages are distributed throughout a vector space of dimension equal to the codeword size.

Combinatoric codes provide a straightforward approach to increasing the Hamming distance between codewords. To create a combinatoric code (also known as a "constant-weight code" or an "r-hot code"), one may select combinations of r bits having a fixed number of 1's from a total codeword space of n bits to produce $$C_r^n = \frac{n!}{r!(n-r)!}$$

codewords of length n. Of course, one can produce a symmetrical code with an identical number of codewords by choosing combinations of r bits having a fixed number of 0's from a total codeword space of n bits. For example, a combinatoric code including $$C_r^n = \frac{n!}{r!(n-r)!} = 165$$

codewords can be obtained by choosing all possible 11-bit codewords with exactly three bits having the value "1," the codewords provided in the following table:

TABLE 1

| | | | | | |
|---|---|---|---|---|---|
| 11100000000 | 11010000000 | 11001000000 | 11000100000 | 11000010000 | 11000001000 |
| 11000000100 | 11000000010 | 11000000001 | 10110000000 | 10101000000 | 10100100000 |
| 10100010000 | 10100001000 | 10100000100 | 10100000010 | 10100000001 | 10011000000 |
| 10010100000 | 10010010000 | 10010001000 | 10010000100 | 10010000010 | 10010000001 |
| 10001100000 | 10001010000 | 10001001000 | 10001000100 | 10001000010 | 10001000001 |
| 10000110000 | 10000101000 | 10000100100 | 10000100010 | 10000100001 | 10000011000 |
| 10000010100 | 10000010010 | 10000010001 | 10000001100 | 10000001010 | 10000001001 |
| 10000000110 | 10000000101 | 10000000011 | 01110000000 | 01101000000 | 01100100000 |
| 01100010000 | 01100001000 | 01100000100 | 01100000010 | 01100000001 | 01011000000 |
| 01010100000 | 01010010000 | 01010001000 | 01010000100 | 01010000010 | 01010000001 |
| 01001100000 | 01001010000 | 01001001000 | 01001000100 | 01001000010 | 01001000001 |
| 01000110000 | 01000101000 | 01000100100 | 01000100010 | 01000100001 | 01000011000 |
| 01000010100 | 01000010010 | 01000010001 | 01000001100 | 01000001010 | 01000001001 |
| 01000000110 | 01000000101 | 01000000011 | 00111000000 | 00110100000 | 00110010000 |
| 00110001000 | 00110000100 | 00110000010 | 00110000001 | 00101100000 | 00101010000 |
| 00101001000 | 00101000100 | 00101000010 | 00101000001 | 00100110000 | 00100101000 |
| 00100100100 | 00100100010 | 00100100001 | 00100011000 | 00100010100 | 00100010010 |
| 00100010001 | 00100001100 | 00100001010 | 00100001001 | 00100000110 | 00100000101 |
| 00100000011 | 00011100000 | 00011010000 | 00011001000 | 00011000100 | 00011000010 |
| 00011000001 | 00010110000 | 00010101000 | 00010100100 | 00010100010 | 00010100001 |
| 00010011000 | 00010010100 | 00010010010 | 00010010001 | 00010001100 | 00010001010 |
| 00010001001 | 00010000110 | 00010000101 | 00010000011 | 00001110000 | 00001101000 |
| 00001100100 | 00001100010 | 00001100001 | 00001011000 | 00001010100 | 00001010010 |
| 00001010001 | 00001001100 | 00001001010 | 00001001001 | 00001000110 | 00001000101 |
| 00001000011 | 00000111000 | 00000110100 | 00000110010 | 00000110001 | 00000101100 |
| 00000101010 | 00000101001 | 00000100110 | 00000100101 | 00000100011 | 00000011100 |
| 00000011010 | 00000011001 | 00000010110 | 00000010101 | 00000010011 | 00000001110 |
| 00000001101 | 00000001011 | 00000000111 | | | |

It is somewhat more complex to encode messages into combinatoric codes, but the logic to do so may be straightforwardly constructed at the logic-circuit level.

Combinatoric codes have a guaranteed minimum Hamming distance of 2, and may have significantly better average Hamming distance separations between codewords. For example, in the above $$\binom{11}{3}$$

code, the average Hamming distance between codewords is 4.39. Combinatoric codes also have an advantage in producing total signal distinguishability within relatively narrow ranges, since these codes have constant weights, where the weight is defined as the number of bits having the value "1."

Another, similar type of code, referred to as a "random" code, is obtained by choosing random codewords of fixed length. For example, one can choose a fixed-length, binary, n-bit codeword size, and select a sufficient number of random n-bit binary numbers in order to obtain a desired number of binary codewords $2^k$, where n>Ak. The greater the value of A, the greater the expected minimum Hamming distance between the codewords. When creating random codes, distance checking can be carried out to reject new codewords that have a Hamming distance less than a minimum value with respect to those codewords already selected, and random codewords having approximately equal numbers of "1" and "0" bits can be used in order to obtain an increased average Hamming distance and increased expected minimum Hamming distance.

Yet another type of code that may be employed in the methods and systems of the present invention is a random linear code. In a random linear code, the generator matrix is randomly generated, under linearity constraints, rather than generated as the combination of a parity-check matrix generated from linear sums of information elements that represent parity-check sums, and an identity matrix. A random linear block code is generally not systematic, but linear.

A balanced linear code is a complementary repetition code based on a linear block code, constructed by appending the complement of each codeword in the linear block code to the codeword to produce a balanced-linear-code codeword. The balanced linear code generated in this fashion from a [n, k, d] linear code produces a constant-weight code. Constant-weight codes are described in a following subsection.

Nanoscale Memory Arrays and Methods for Addressing Nanoscale Memory Arrays

In the current subsection, a combined microscale/nanoscale electronic memory device is discussed. The present invention is not limited in applicability to microscale/nanoscale electronic memory devices, or even to microscale/nanoscale electronic devices, but may also find application in purely nanoscale interconnection interfaces and other nanoscale devices, and may also find application in sub-microscale electronic devices, interconnection interfaces, and memories. In the described embodiment, single nanowires are uniquely addressed by addresses transmitted to intersecting microscale address signal lines. In other circuits, subsets of nanowires may be addressed, rather than single nanowires, by a single address. The present invention is related to general addressing of components within a circuit, and not limited to uniquely addressing single components or signal lines, nor limited to components or signal lines of particular sizes.

FIG. 1 shows a diagram of a combined nanoscale/microscale electronic memory device. The combined microscale/nanoscale electronic memory device 100 interfaces to an external electronic environment through reference voltage signal lines 102 and through two sets of address signal lines 104 and 106. The memory elements within the combined microscale/nanoscale electronic memory device 100 can logically be considered to compose a two-dimensional array, with each memory element specified by a pair of coordinates (x,y), where the x coordinate specifies the row of the two-dimensional array inhabited by the memory element and the y coordinate specifies the column of the two-dimensional array inhabited by the memory element. The set of address signal lines 106 may be used to specify one of $2^p$ two-dimensional memory-element-array rows, where p is the number of address signal lines in the set of address signal lines 106, and the set of address signal lines 104 specifies one of $2^q$ columns in the logical, two-dimensional array of memory elements, where q is the number of address signal lines in the set of address signal lines 104. Although the dimensions p and q of the two-dimensional array of memory elements need not be equal, in the following discussion, both dimensions will be assumed to be equal to p, in the interest of notational brevity.

The external sets of address signal lines 104 and 106 are electronically used within the electronic memory device 100 to select a column and row of nanowire-crossbar memory-element subarrays, and therefore a particular nanowire-crossbar memory-element subarray, and to select a particular row or column within a selected nanowire-crossbar array. For example, in one configuration, the upper three address signal lines 108 of the set of address signal lines 106 may specify one of seven horizontal rows 110-116 of nanowire-crossbar subarrays, and the upper three address signal lines 118 of the set of address signal lines 104 may specify one of six vertical columns 120-125 of nanowire crossbar memory-element subarrays. The lower three address signal lines 126 in the set of address signal lines 106 specify a particular row of nanoscale memory elements within a selected nanowire-crossbar memory-element subarray, and the lower three address signal lines 128 in the set of address signal lines 104 specifies a particular column of nanoscale memory elements within a selected nanowire-crossbar memory-element subarray. Note that, in general, a larger number of input address signal lines would be employed to address a larger number of columns and rows of nanowire-crossbar memory-element subarrays than shown in FIG. 1, as well as a larger number of nanoscale-memory-element rows and columns within each nanowire-crossbar memory-element subarray. The small number of input address lines shown in FIG. 1 is chosen for illustration convenience only.

Each row and column of nanowire-crossbar memory-element subarrays is accessed through an encoder 130-142. The encoder receives, in FIG. 1, the high-order three input address signal lines and outputs a larger number of coded address signal lines. For example, encoder 137 receives three address signal lines 144 directly interconnected with the high-order input address signal lines 128, and outputs five coded address signal lines 146. The address signal lines output by an encoder pass through all of the nanowire-crossbar memory-element subarrays within the column or row accessed via the encoder. For example, the five coded address signal lines 146 output by the encoder 137 pass through nanowire-crossbar memory-element subarrays 150-156. Each nanowire-crossbar memory-element subarray is also connected to two reference voltage signal lines. For example, nanowire-crossbar memory-element subarray 150 is connected to the reference voltage through reference-voltage signal lines 158 and 160.

The input address signal lines may be microscale address signal lines, or may have even larger dimensions. The coded address signal lines are generally microelectronic or submicroelectronic signal lines produced by currently available photolithographic techniques. The nanowire-crossbar memory-element subarrays, by contrast, are composed of nanoscale wires, or nanowires. Nanowires have cross-sectional diameters of less than 100 nanometers, while submicroelectronic signal lines have cross-sectional diameters of greater than 100 nanometers. Therefore, there are two nanoscale interconnection interfaces within each nanowire-crossbar memory-element subarray. In general, the circuitry within the encoders 130-142 is significantly more complex than the circuitry within the nanowire-crossbar memory-element subarrays. However, each encoder provides access to an entire row or column of nanowire-crossbar memory-element subarrays, so that only a fraction of the area of an encoder needs to be allocated to any one memory crossbar. As is discussed below, in great detail, defect and fault-tolerant nanoscale interconnection interfaces are facilitated by the supplemental address signal lines output by each encoder.

Figure 2:
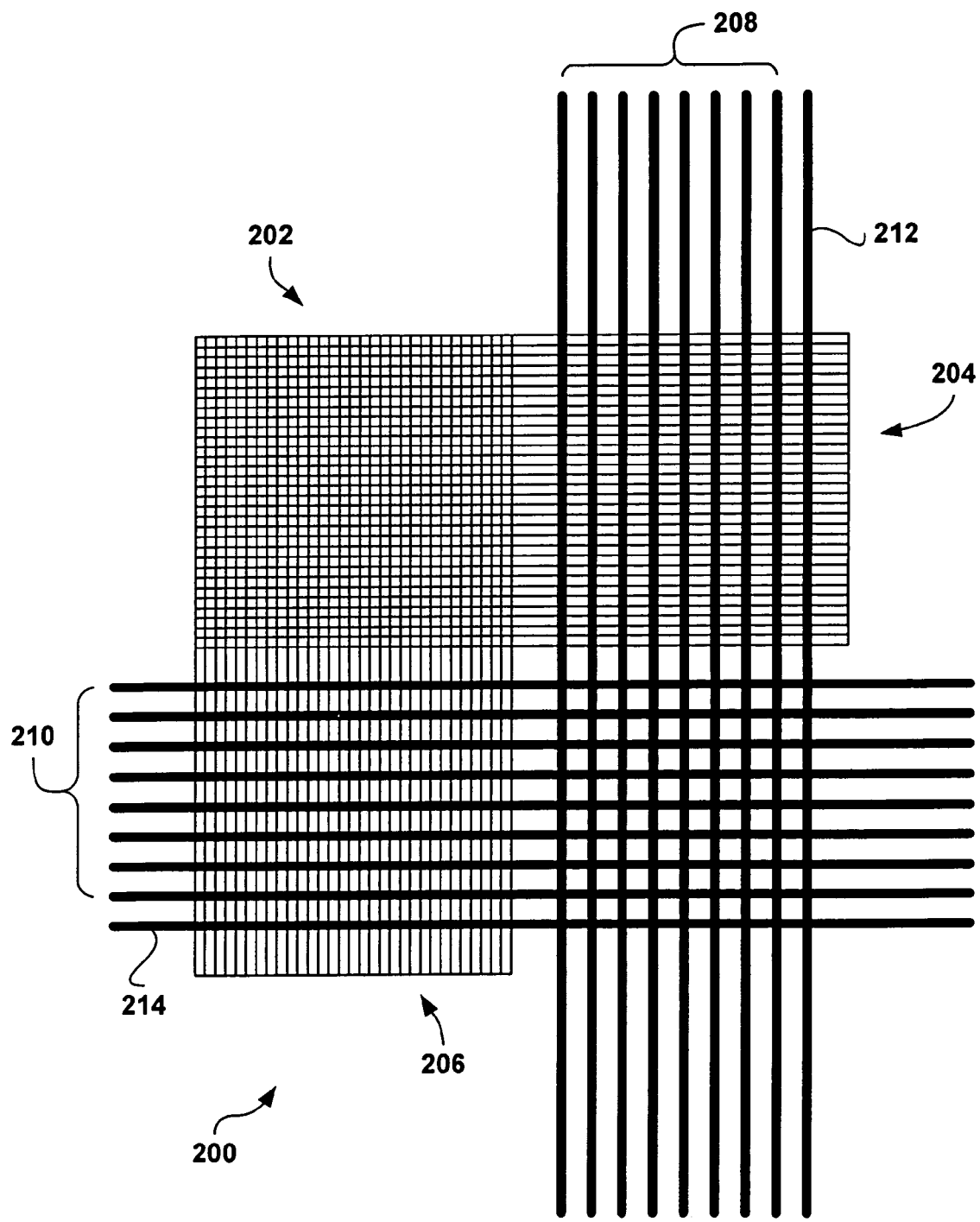
FIG. 2 shows an abstract representation of a nanowire-crossbar memory-element subarray within a combined nanoscale/microscale electronic memory device.

FIG. 2 shows an abstract representation of a nanowire-crossbar memory-element subarray within a combined nanoscale/microscale electronic memory device. The nanowire-crossbar memory-element subarray 200 is composed of a nanowire crossbar 202 with a similarly sized region 204 of horizontally extending nanowires and a similarly sized region 206 of vertically extending nanowires. A vertical column 208 of microelectronic coded address signal lines passes over the region of horizontally extending nanowires 204, with selective rectifying connections, or nanoscale, molecular-junction diode connections, interconnecting microelectronic internal signal lines with particular horizontal extending nanowires. In alternative embodiments, resistive ohmic connections, semi-conductor gate connections, or other types of physical methods at nanowire-crossbar junctions that determine the signals on the nanowires 204 may be employed. Similarly, a horizontal set 210 of microelectronic coded address signal lines passes over the region 206 of vertically extending nanowires, with the horizontal microelectronic address signal lines selectively interconnected via rectifying connections, or molecular diodes, to selected vertically extending nanowires. Note that each horizontally and vertically extended nanowire is also connected, through a resistive connection, to a vertical reference-voltage signal line 212 and a horizontal reference-voltage signal line 214, respectively. Each unique pattern of ON and OFF voltages, or, equivalently, HIGH and LOW voltages, on the set of vertical internal microelectronic address signal lines 208 uniquely addresses a particular, horizontally extending nanowire, and places that selected nanowire at a significantly different voltage than the remaining horizontally extending nanowires. Similarly, each different pattern of ON and OFF voltages on the set 210 of horizontal internal microelectronic address signal lines selects a unique vertically extending nanowire, and places that selected vertically extending nanowire at a significantly different voltage than the remaining vertically extending nanowires. The selected horizontally extending nanowire and the selected vertically extending nanowire are interconnected at a single crossover point within the nanowire crossbar, and the nanowire-crossbar junction at that crossover point is placed at a different voltage level than all other nanowire-crossbar junctions within the nanowire crossbar via the pattern of ON and OFF voltages present on the set of vertical and horizontal internal microelectronic signal lines 208 and 210.

A variety of different types of nanowire crossbars have been designed and prototyped in laboratories around the world. Different types of nanowire crossbars have different chemical and physical properties at the nanowire-crossbar junctions within the nanowire crossbar. Initially, significant efforts were directed to developing diode-like nanowire-crossbar junctions that provide good voltage margins and that prevent many undesired signal paths within a nanowire crossbar. However, diode-like junctions have proven to be difficult to reliably manufacture. Currently, a large effort is being devoted to designing and fabricating nanowire crossbars with hysteretic-resistor junctions.

Figure 3:
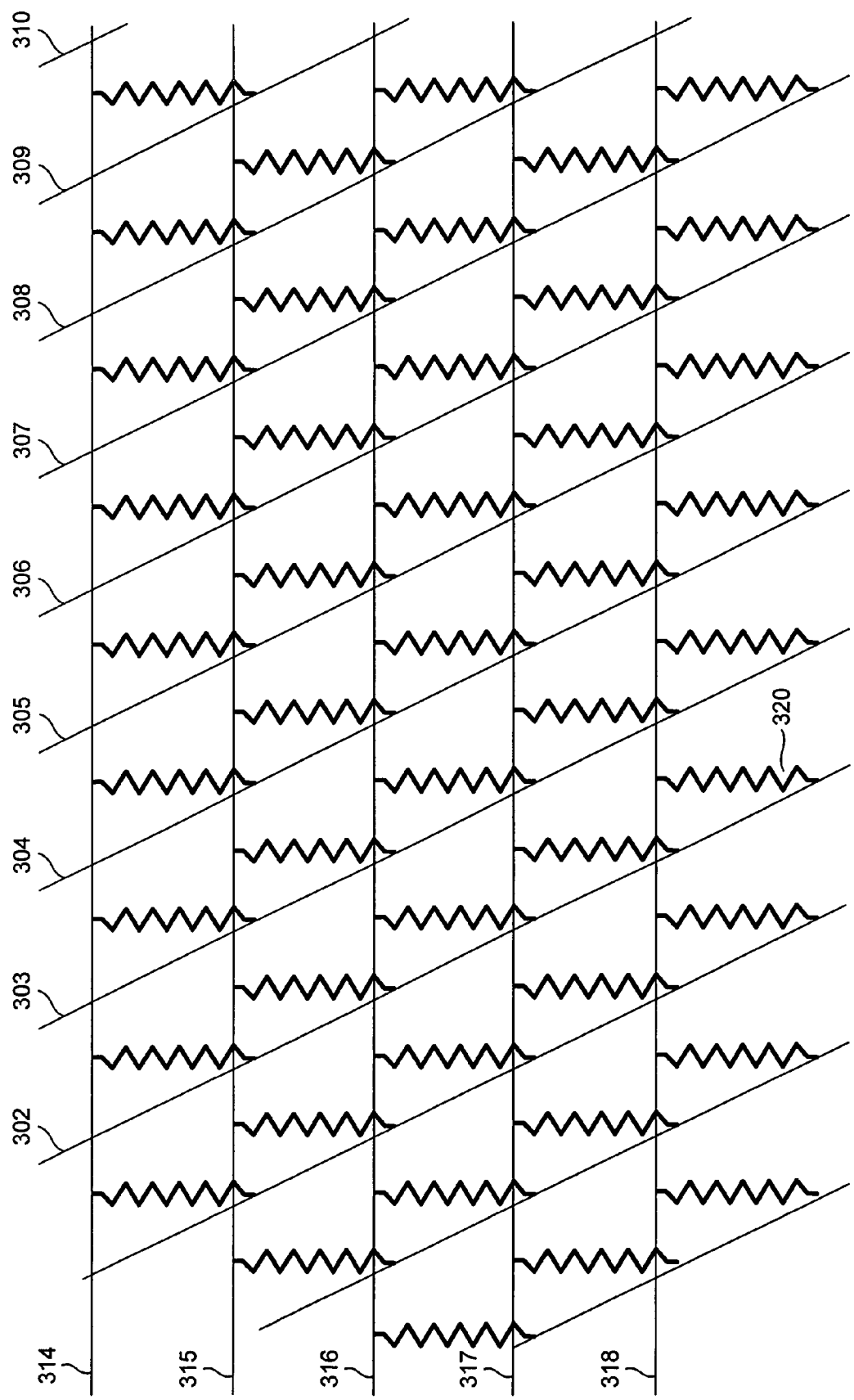
FIG. 3 illustrates a portion of a grid-like nanowire crossbar featuring hysteretic-resistor junctions.

FIG. 3 illustrates a portion of a grid-like nanowire crossbar featuring hysteretic-resistor junctions. As shown in FIG. 3, the nanowire crossbar comprises a first set of parallel nanowires 302-310 and an overlying, second set of parallel nanowires 314-318 roughly orthogonal to the first set of parallel nanowires 302-310. As shown in FIG. 3, each nanowire of the second set of overlying, parallel nanowires 314-318 is connected to each nanowire of the first set of nanowires 302-310 via a single hysteretic resistor, such as hysteretic resistor 320 interconnecting nanowire 318 with underlying nanowire 302. Each hysteretic resistor has at least two different, stable resistance states. A relatively high-resistance state is arbitrarily assigned the Boolean value "0," and a relatively low-resistance state is assigned the Boolean value "1." Thus, each hysteretic-resistor nanowire-crossbar junction, or memory element, can store a single bit of information. The resistance state of a nanowire-crossbar junction can be reversibly switched from the high-resistance state to the low-resistance state and from the low-resistance state to the high-resistance state by applying relatively large voltage drops across the nanowire-crossbar junction. Hysteretic resistors are discussed in greater detail in the following subsection.

Figure 4:
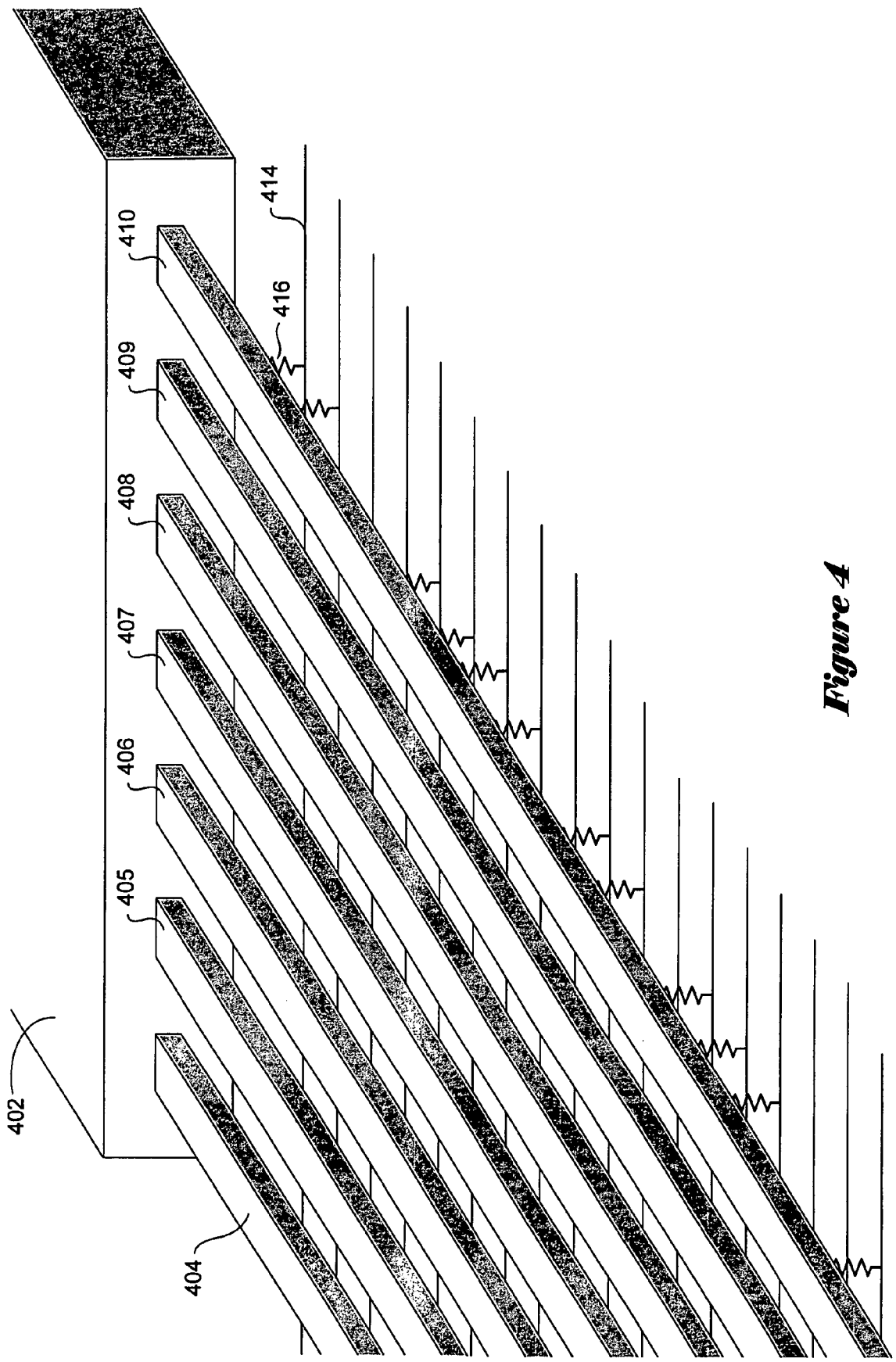
FIG. 4 illustrates the microscale/nanoscale crossbar and encoder of a microscale/nanoscale encoder-demultiplexer that is used, in combination with another microscale/nanoscale encoder-demultiplexer, to address individual nanowire-crossbar junctions of a nanowire crossbar.

FIG. 4 illustrates the microscale/nanoscale crossbar and encoder of a microscale/nanoscale encoder-demultiplexer that is used, in combination with another microscale/nanoscale encoder-demultiplexer, to address individual nanowire-crossbar junctions of a nanowire crossbar in nanoscale-memory-array embodiments of the present invention. The encoder 402 receives an input address a (not shown in FIG. 4) and outputs a nanowire-selection voltage pattern u on a number of microscale output signal lines 404-410. The microscale output signal lines 404-410 are selectively interconnected with nanowires, such as nanowire 414, through resistive junctions, such as resistive junction 416. Unlike in the case of the nanowire crossbar, discussed above with reference to FIG. 3, the resistive microscale/nanoscale junctions of the microscale/nanowire crossbar portion of an encoder-demultiplexer do not need to be reversibly switched between different resistance states. Instead, the pattern of interconnections between microscale output signal lines 404-410 and nanowires, such as nanowire 414, result in electronic selection of a single nanowire from among a large number of nanowires that can each be separately addressed by the microscale/nanoscale encoder-demultiplexer. Thus, the nanowire crossbar employed as a nanoscale memory array includes hysteretic resistors at each junction, the resistance states of which can be reversibly changed in order to store information, while the junctions between microscale output signal lines and nanowires in the microscale/nanowire crossbar of a microscale/nanoscale encoder-demultiplexer are either manufactured to contain a resistive interconnection, manufactured to contain no interconnection, or are stably configured at a time after manufacturing.

Physical and Electronic Characteristics of Hysteretic Resistors

Figure 5A:
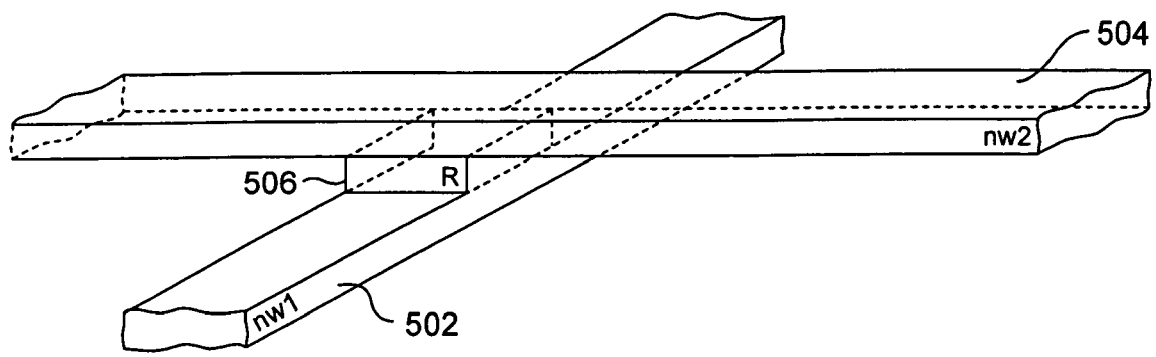
FIGS. 5A-C provide different illustrations of a resistor-like nanowire-crossbar junction.
Figure 5B:
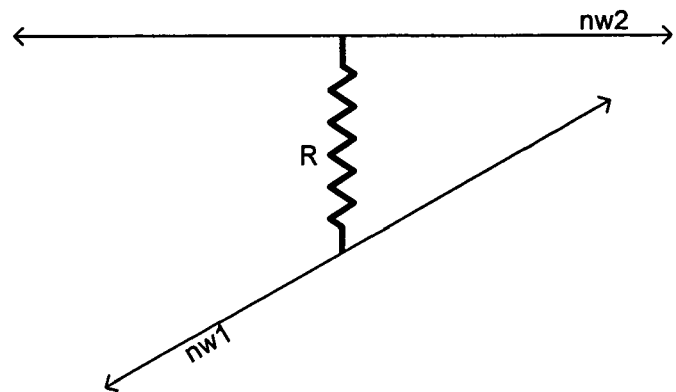
Figure 5C:
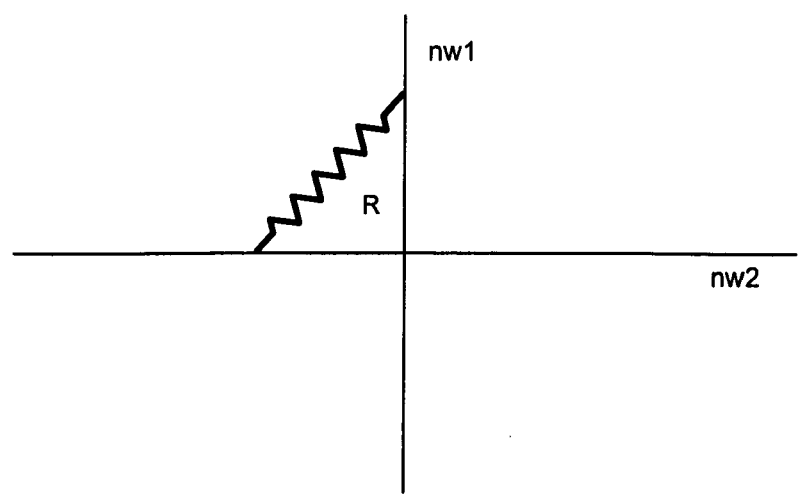

Embodiments of the present invention include nanoscale memory arrays with resistor-like nanowire-crossbar junctions. FIGS. 5A-C provide different illustrations of a resistor-like nanowire-crossbar junction. In FIG. 5A, a physical representation of the resistive nanowire-crossbar junction is provided to represent a picture of a resistive, nanowire-crossbar junction that might be obtained were optical microscopes of sufficient power available to image nanowire-crossbar junctions. As shown in FIG. 5A, a first nanowire 502 underlies a second nanowire 504, with the two nanowires 502 and 504 approximately perpendicular to one another. A resistive element 506 lies between the two nanowires, in the region of overlap between the two nanowires. Nanowires may be composed of a few, parallel strands of a conducting polymer, a carbon nanotube, a polymer-like chain of metal or semiconductor atoms or molecules, or other conducting or semiconducting materials that can be fabricated at molecular dimensions. The shapes and cross-sectional geometries of nanowires are determined by the molecules that compose them, but generally are complex at molecular dimensions, rather than the simple rectangular shapes shown in FIG. 5A. The resistive element 506 that lies between the two nanowires at their point of closest contact may be composed of one or a small number of molecules that behave as an electrical resistor. A voltage can be applied across a nanowire-crossbar junction so that an amount of current flows through the junction that is proportional to the applied voltage and inversely proportional to the resistance of the resistive element 506, according to Ohm's Law. FIG. 5B shows a more schematic illustration of the resistive nanowire-crossbar junction shown in FIG. 5A. FIG. 5C shows a fully schematic illustration of the resistive nanowire-crossbar junction shown in FIG. 5A. The schematic convention shown in FIG. 5C is employed throughout the remaining figures to represent resistive nanowire-crossbar junctions.

One particularly important type of resistive junction that can be fabricated by currently available techniques is a hysteretic, resistive nanowire-crossbar junction. The resistance of a hysteretic, resistive nanowire-crossbar junction can be controlled, by application of state-transition voltages to the hysteretic, resistive nanowire-crossbar junction, the resistance alternating between two, bistable resistance states. In one resistance state, the nanowire-crossbar junction has a relatively low resistance, or impedance, and in the other resistance state, the nanowire-crossbar junction has a relatively high resistance or impedance. In the current discussion, the time-dependent behavior of nanowire-crossbar junctions resulting from internal capacitances and other properties is ignored, and the terms "resistance" and "impedance" are therefore interchangeable.

Figure 6:
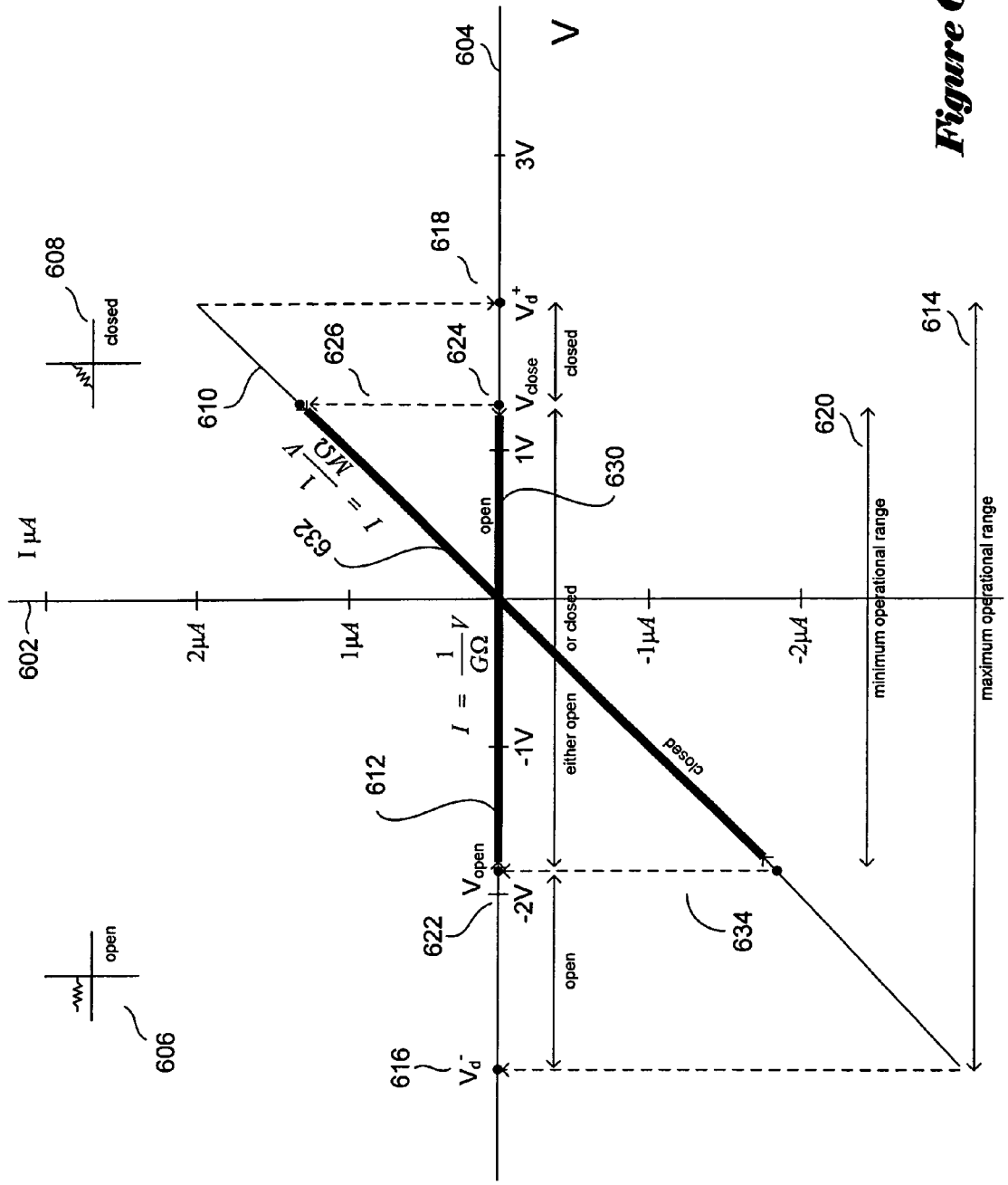
FIG. 6 shows the bistable resistance states of a hysteretic-resistor nanowire-crossbar junction and resistance-state transitions under operational control voltages.

FIG. 6 shows the bistable resistance states of a hysteretic-resistor nanowire-crossbar junction and resistance-state transitions under operational control voltages. FIG. 6 shows plotted current/voltage relationships with respect to a vertical current axis 602 and a horizontal voltage axis 604. The vertical current axis is incremented in microamperes (μA), and the voltage axis 604 is incremented in volts (V). The high resistance state of the hysteretic, resistive nanowire-crossbar junction is referred to as the "open" state, schematically represented by the open-switch-like representation of the nanowire-crossbar junction 606 above a portion of the negative voltage axis. The low resistance state of the hysteretic, resistive nanowire-crossbar junction is referred to as the "closed" state, represented by the closed-switch-like schematic 608 shown in FIG. 6 above the positive portion of the voltage axis. FIG. 6 shows the operational characteristics of an actual hysteretic, resistive nanowire-crossbar junction prepared in the laboratory. The current/voltage relationship for the closed state is plotted as straight line segment 610, and the current/voltage relationship of the open state is plotted as straight line segment 612, imperceptivity positively slanted with respect to the horizontal axis. The closed-state current/voltage relationship can be expressed as:

$$I = \frac{1}{M\Omega}V$$

and the open-state current/voltage relationship can be expressed as:

$$I = \frac{1}{G\Omega}V$$

The maximum operational voltage range 614 for the hysteretic, resistive nanowire-crossbar junction ranges from just above a negative destructive voltage $V_d^-$ 616 and just below a positive destructive voltage $V_d^+$ 618. When the hysteretic, resistive nanowire-crossbar junction is in the open, high-resistance state, the voltage can range over a minimum operational voltage range 620 without the hysteretic, resistive nanowire-crossbar junction undergoing a resistance-state transition to the closed state. The minimum operational range ranges from the negative voltage $V_{open}$ 622 to the positive voltage $V_{close}$ 624. As the applied voltage increases to $V_{close}$ 624, the hysteretic, resistive nanowire-crossbar junction abruptly transitions 626 to the closed state, represented in FIG. 6 by the dashed arrow 626 interconnecting the end points of the two voltage segments 630 and 632 representing the operational voltage-range segments of the open and closed current/voltage relationships, respectively. The voltage can be increased above $V_{close}$ up to just below the destructive positive voltage $V_d^+$, after which point further voltage increase would irreversibly destroy the hysteretic, resistive nanowire-crossbar junction. As the voltage is decreased, while the hysteretic, resistive nanowire-crossbar junction is in the closed state, the corresponding current flow decreases to zero and then begins to increase in the opposite direction. As the applied negative voltage approaches $V_{open}$ in magnitude, the hysteretic, resistive nanowire-crossbar junction abruptly transitions from the closed state to the open state, as represented by the dashed, vertical arrow 634 in FIG. 6. The voltage can be further decreased, with the hysteretic, resistive nanowire-crossbar junction remaining in the open state, until the negative voltage $V_d^-$ is reached, after which point a further decrease in voltage irreversibly destroys the hysteretic, resistive nanowire-crossbar junction.

The hysteretic, resistive nanowire-crossbar junction therefore occupies the open state, or high resistance state, between voltages $V_d^-$ and $V_{open}$, at the extreme negative voltage portion of the maximum operational voltage range, occupies the closed state, or low resistance state, in the extreme positive voltage portion of the maximum operational voltage range, between voltages $V_{close}$ and $V_d^+$, and can occupy either of the open or closed states throughout the minimum operational voltage range 620, depending on the last state transition that occurred, either the closed-state-to-open-state transition 634 or the open-state-to-closed-state transition 626.

Constant-Weight Codes Used in Various
Embodiments of the Present Invention

Constant-weight codes are a superclass of balanced linear codes. However, unlike balanced linear codes, there are generally no simple matrix generators for constant-weight codes, although a certain class of relatively sparse, constant-weight codes can be easily generated from balanced linear codes. Constant-weight codes are well-known error-control-encoding codes, and many examples of constant-weight codes with desirable properties have been developed and published.

For the purposes of the current discussion, constant-weight codes can be thought of as represented by code tables. FIG. 7 shows a table representing a constant-weight error-control-encoding code. The table 702 shown in FIG. 7 includes a first column 704 containing a list of addresses $a_1$-$a_{m-1}$ and a second column 706 of corresponding code words $u_1$-$u_{m-1}$. Thus, there is a unique codeword $u_i$ that corresponds to each address $a_i$. In the constant-weight-code table 702 in FIG. 7, the first four rows 708 contain addresses and corresponding code words represented as binary numbers, while the remaining rows show symbolic representations of the addresses and corresponding code words. The addresses all have a fixed length, in binary digits, of k. The code words have a fixed length of n binary digits. The number of code words in the constant-weight code is M, or, in other words, the length of the table. In many linear block codes, code sizes are exact powers of two. Constant weight codes, by contrast, are not. Therefore, while k=log$_2$M for many linear block codes, k is generally equal to ceiling(log$_2$M) for constant weight codes.

Figure 8:
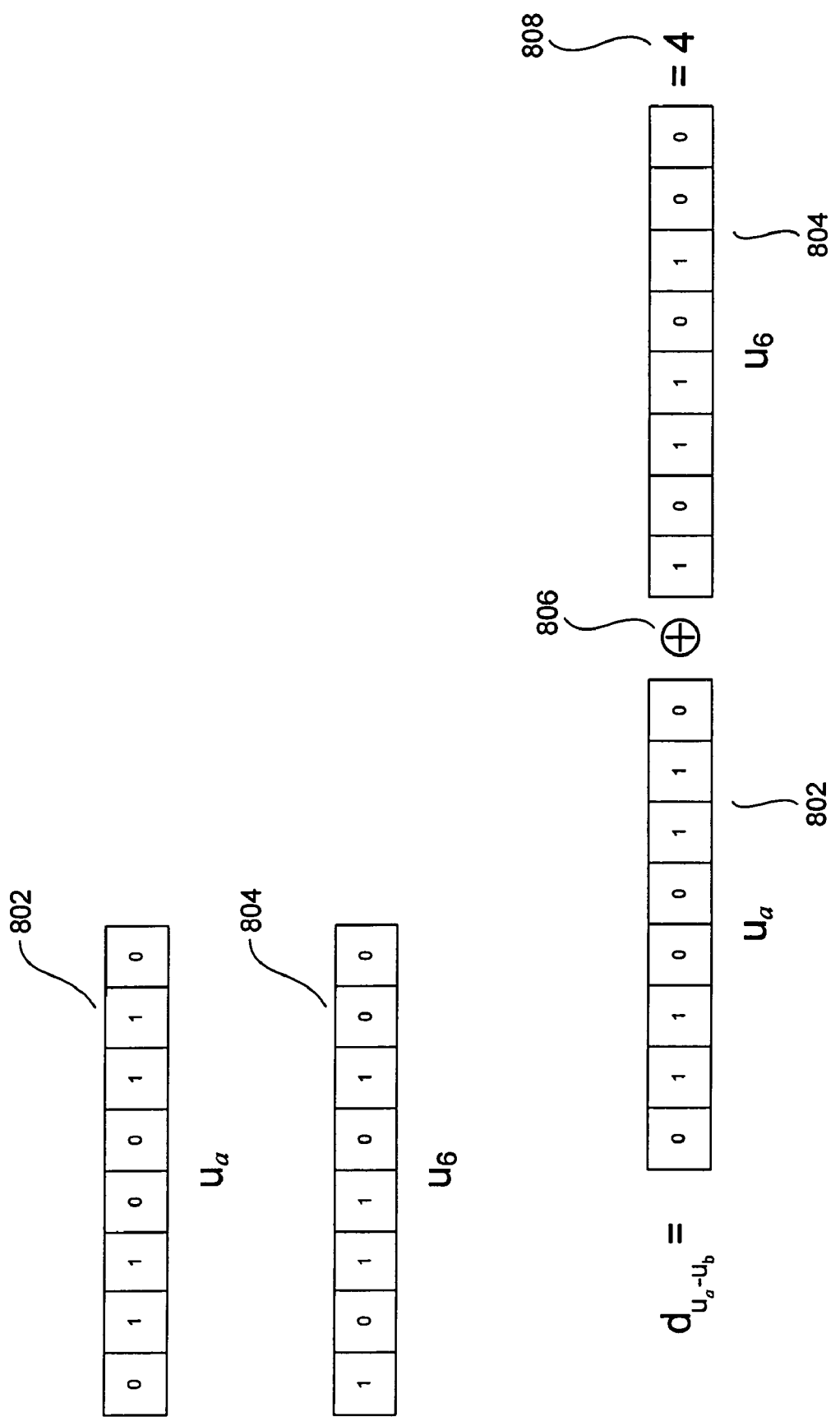
FIG. 8 illustrates computation of the distance between two code words, $u_a$ and $u_b$, of a binary code, such as a constant-weight code.

FIG. 8 illustrates computation of the distance between two code words, u$_a$ and u$_b$, of a binary code, such as a constant-weight code. FIG. 8 shows binary, row-vector representations of two code words u$_a$ 802 and u$_b$ 804 and illustrates the calculation of the distance between code words u$_a$ and u$_b$, $d_{u_a}{}^{-u}{}_b$, as the bitwise exclusive OR 806 of code words u$_a$ 802 and u$_b$ 804. For the particular code words shown in FIG. 8, the distance equals 4 (808 in FIG. 8), which is the number of positions within the bit-vector representations of the code words at which the two code words differ in value.

Figure 9:
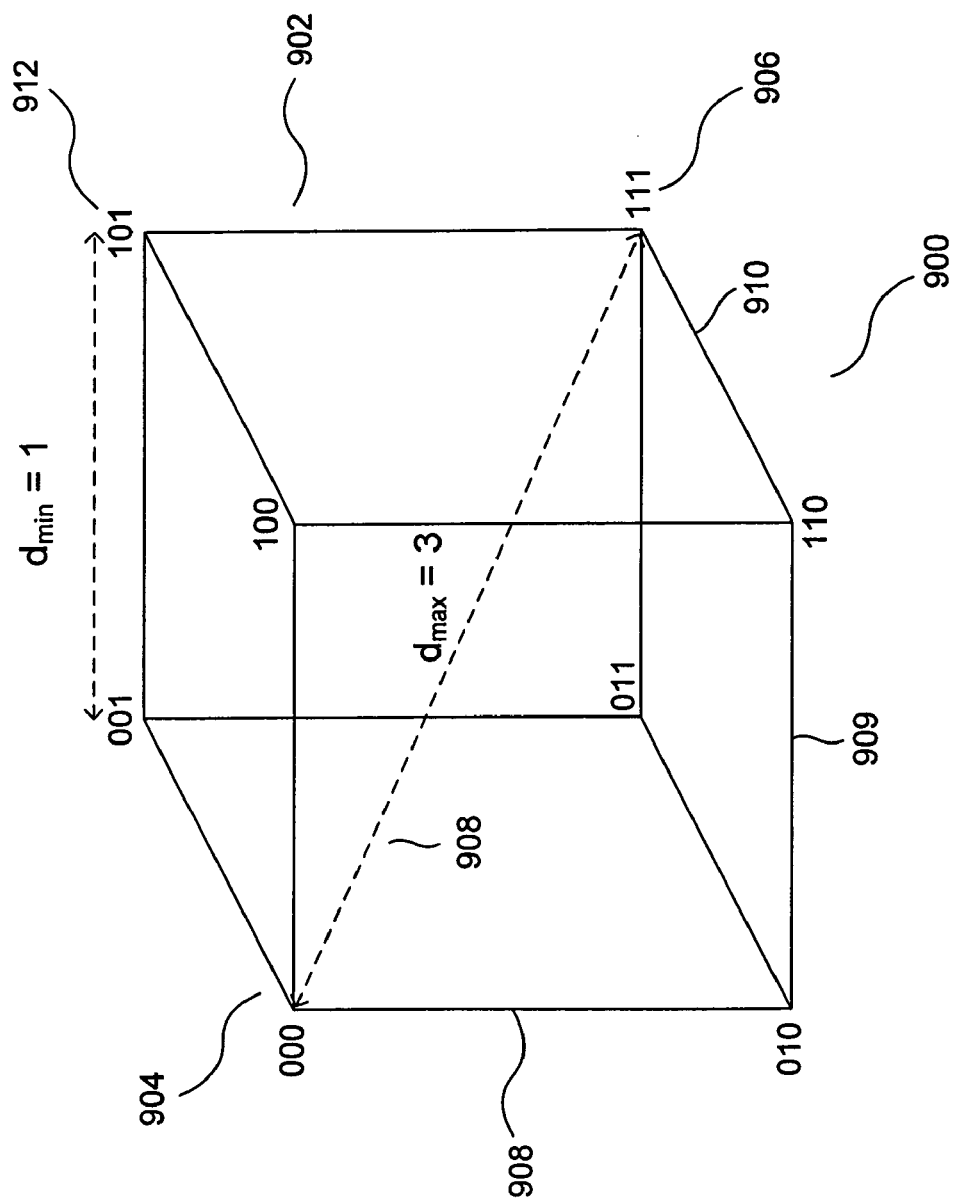
FIG. 9 illustrates the concept of distance for a set of eight three-bit vectors.

FIG. 9 illustrates the concept of distance for a set of eight three-bit binary vectors. The eight three-bit binary vectors label each vertex of a cube 900 in FIG. 9. The distance d between any two three-bit vectors is equal to the minimum number of edges of a cube that need to be traversed in order to travel from the first three-bit vector to the second three-bit vector of the three-bit vector pair. For example, in FIG. 9, the distance between three-bit vector "000" 904 and three-bit vector "111" 906 is three 908. One minimum-length path between vector "000" and vector "111" constitutes edges 908-910. Vectors of greater length may be considered to label vertices of hyper-dimensional cubes, with the distance between vectors equal to the minimum hyper-dimensional-cube path length between the vertices labeled by the vectors. In FIG. 9, the minimum distance between a pair of vectors, $d_{min}$, is 1, or a single edge, the maximum distance between any two vectors, $d_{max}$, is 3, corresponding to a two vertices interconnected by body diagonal through the cube, and pair of vertices may also be separated by an intermediate distance of 2, such as vertices 904 and 912.

Figure 10:
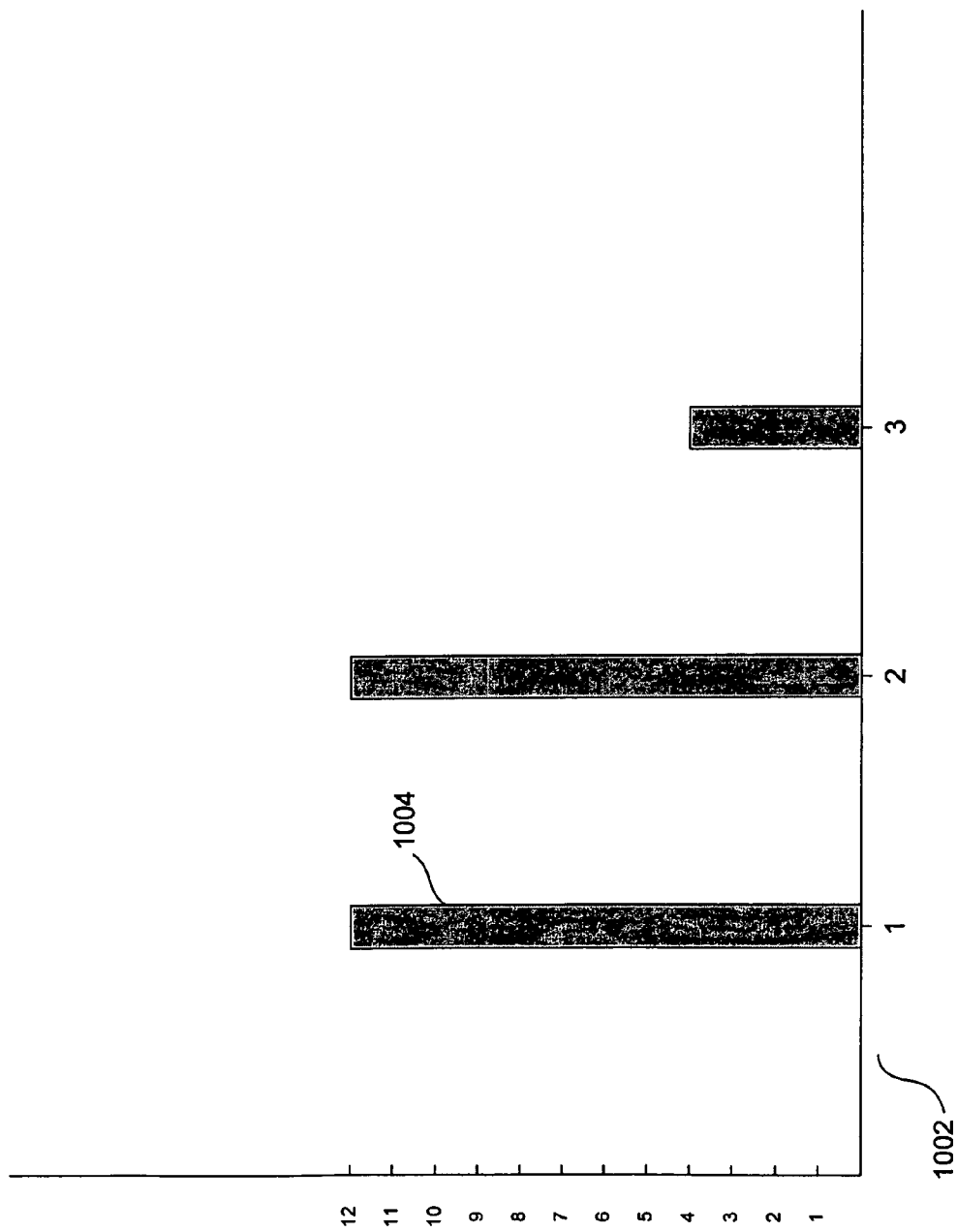
FIG. 10 shows a distance profile for the set of three-bit vectors discussed with reference to FIG. 9.

FIG. 10 shows a distance profile for the set of three-bit vectors discussed with reference to FIG. 9. The distance profile 1002 is a plot of the number of unique vector pairs at each possible distance, in histogram form. For example, the first column 1004 of the histogram represents the fact that 12 different pairs of three-bit vectors are separated from one another by a distance of 1. The distance profile for the set of three-bit vectors discussed with reference to FIG. 9 has a simple geometric explanation. A cube has 12 different edges, and therefore 12 pairs of vertices are separated from one another by a single edge length. A cube has four different body diagonals, and therefore there are four different pairs of vectors separated from one another by a distance of 3. Finally, a cube has six faces, each face having two face diagonals, with each face diagonal representing a different pair of vertices separated by a distance of two edges, for a total of (6)(2)=12 pairs of vertices at a distance of 2. Note also that the exclusive OR of any pair of three-bit vectors, discussed with reference to FIG. 9, produces the same distance as determined by path length in edges between labeled vertices of the cube in FIG. 9.

FIG. 11 illustrates determination of the weight of a code word. The weight of a code word is the sum of the bit values contained in the bit vector representing the code word. In other words, the weight of a code word is the number of "1" bits within the code word. The weight of a code word can be computed either by counting the number of "1" bits 1102 in the bit vector representation of the code word, or can be alternatively computed as the distance between the code word and the all-0-bit code word u$_0$ 1104. The weight of a code word may be specified in functional form as w(u), or alternatively as w$_u$.

Figure 12:
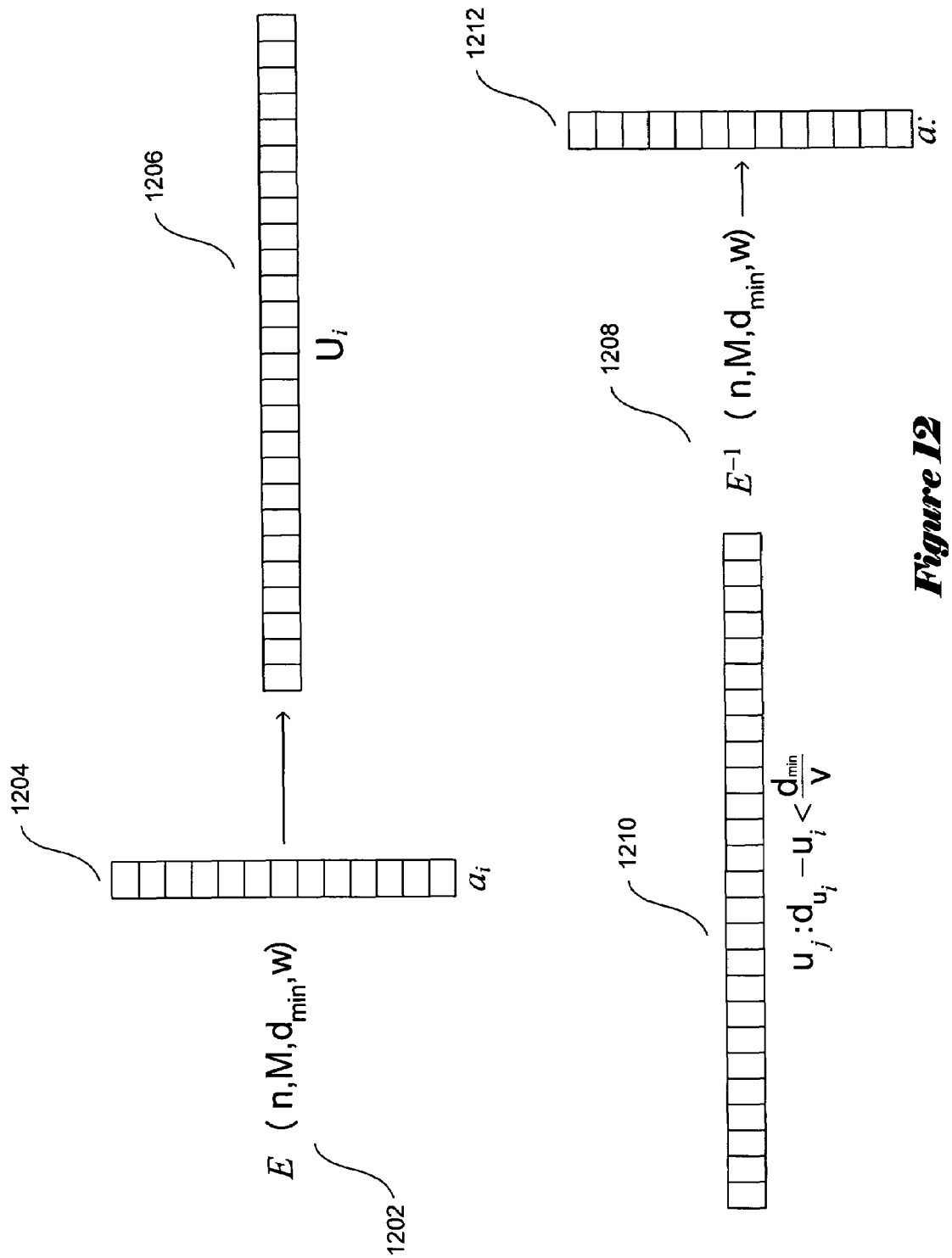
FIG. 12 illustrates a constant-weight code.

Having discussed the weight of a code word w(u), the minimum distance between two code words in a set of code words, $d_{min}$, the length of a code M, and the length of code words n, the notational convention used for specifying constant-weight codes can now be described. FIG. 12 illustrates a constant-weight code. A constant-weight code is specified as a four-integer tuple (n, M, dmin, w) where n is the length of the code words, M is the number of code words in the code, or size of the code, $d_{min}$ is the smallest distance between any two code words in the code, and w is the weight of each code word in the code. As the name implies, in a constant-weight code, all code words have an identical, fixed weight w. A constant-weight code can be thought of an operator E(n, M, $d_{min}$, w) 1202 that operates on an address vector a$_i$ 1204 to produce a code word u$_i$ 1206. A constant-weight code is also characterized by a reverse operator E$^{-1}$ (n, M, $d_{min}$, w) 1208 that operates on an n-length bit vector 1210 to produce an address vector a$_i$ 1212. While the encryption operator E(n, M, $d_{min}$, w) produces a single, unique code word u$_i$ for each address a$_i$, the inverse operator E$^{-1}$ (n, M, $d_{min}$, w) maps all code words within some distance of code word u$_i$ to the address a$_i$ corresponding to code word u$_i$. This many-to-one mapping of the reverse operator E$^{-1}$ is the basis for the error-correction aspect of constant-weight codes, and other error-correction codes. Text or numeric values that need to be transferred through a noisy channel are broken up into segments of length k, each segment is considered to be an address, the addresses are encoded by a constant-weight-code operator E as a sequence of code words, and the code words are transmitted. A small number of errors in a received code word, generally less than $$\frac{d_{min}}{2},$$

can be tolerated by the reverse operator E$^{-1}$ that maps the code words back to the unencoded information.

EMBODIMENTS OF THE PRESENT INVENTION

Method embodiments and device embodiments of the present invention employ constant-weight codes in microscale/nanoscale encoder-demultiplexers that are used, in pairs, to address nanowire-crossbar junctions within nanowire crossbars, including the memory elements in nanoscale memory arrays. However, a single constant-weight-code-based-encoder-demultiplexer embodiment of the present invention may be used to address nanowires of a single set of nanowires, or latches of a latch array, or other types of nanoscale and mixed-scale devices. Furthermore, more than two constant-weight-code-based-encoder-demultiplexer embodiments of the present invention may be used to address nanowires or other components within nanoscale or mixed-scale devices with greater dimensions, including nanoscale components arranged in 3-diemenional volumes. The nanoscale-memory-array embodiments described below are only one of a large number of different types of electronic devices in which constant-weight-code-based-encoder-demultiplexer embodiments of the present invention may be used.

Figure 13:
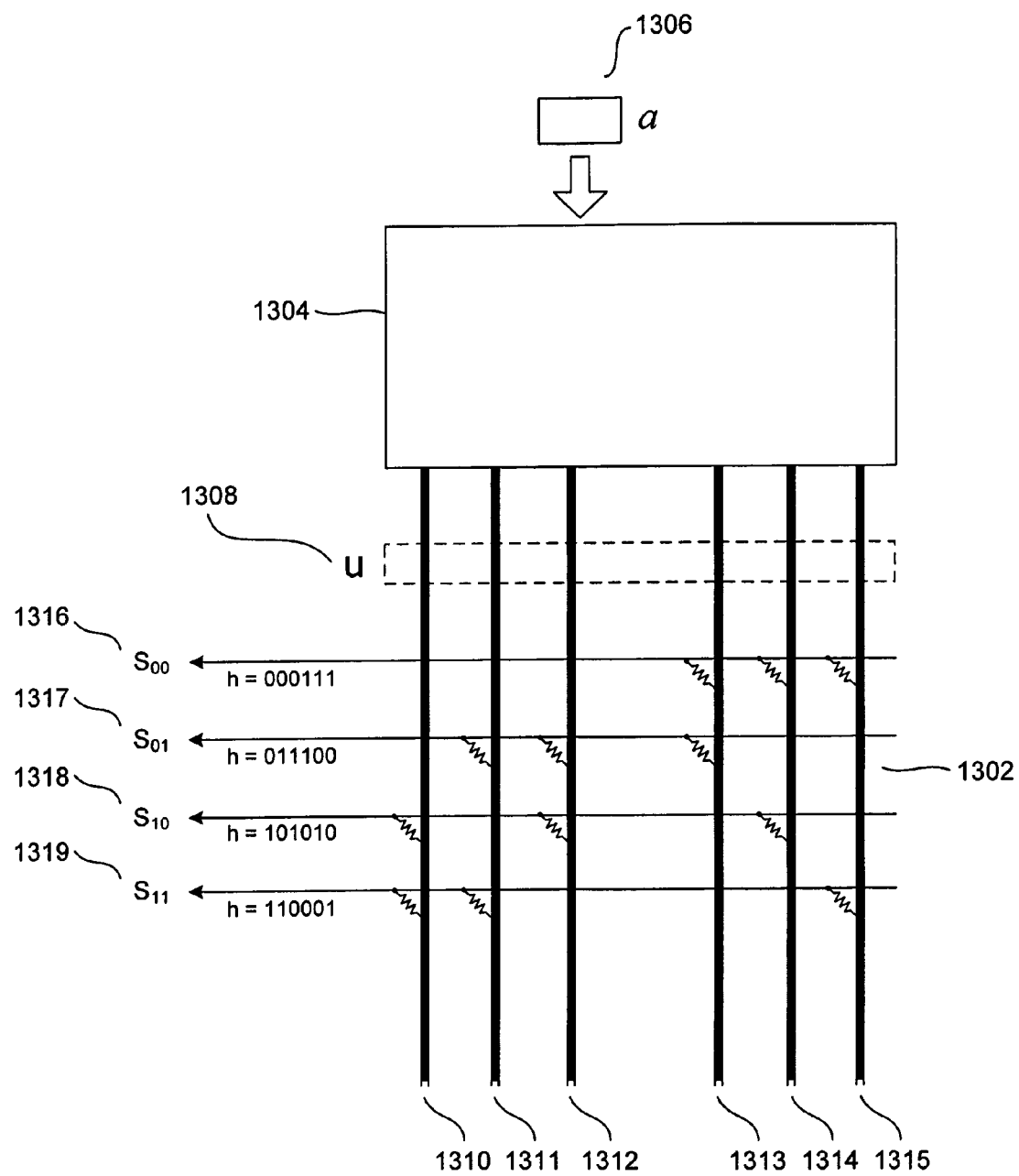
FIG. 13 illustrates a microscale/nanoscale encoder-demultiplexer employed in various embodiments of the present invention.

FIG. 13 illustrates a microscale/nanoscale encoder-demultiplexer employed in various embodiments of the present invention. As discussed above, a microscale/nanoscale encoder-demultiplexer includes a microscale/nanowire crossbar 1302 and an encoder 1304. Microscale/nanoscale encoder-demultiplexers of the present invention include encoders 1304 that implement a constant-weight-code encoding operator E(n, M, $d_{min}$, w), either algorithmically or by table lookup. The encoder 1304 receives a k-bit external nanowire address a 1306 and translates the input address a into a constant-weight-code code word u 1308. The code word u is output by the encoder 1304 as a pattern of high and low voltages on microscale output signal lines 1310-1315. The microscale output signal lines are selectively interconnected with nanowires 1316-1319 by resistive junctions, such as resistive junction 1322. The signals output by the encoder on the microscale output signal lines 1310-1315 result in voltages output to the nanowires 1316-1319. For any particular pattern of voltages output from the encoder, corresponding to a constant-weight code word u, a pattern of voltage outputs will occur on the nanowires, with the highest voltage output to the nanowire with an internal nanowire address h equal to the output code word u.

As can be seen in FIG. 13, the nanowire address h can be directly read from the pattern of resistors interconnecting the nanowire with the microscale output signal lines emanating from the encoder. For example, considering nanowire 1316 with nanowire address h equal to 000111, the pattern of resistive interconnections between the nanowire and the microscale output signal lines, starting from the left and advancing rightward, is "0," "0," "0," "1," "1," and "1," with "0" indicating no connection and "1" indicating a resistive interconnection between the nanowire and a microscale output signal line. The nanowires are labeled with names of the form $S_{xx}$, where "xx" equals the two-binary-digit external address a of the nanowire.

Figure 14A:
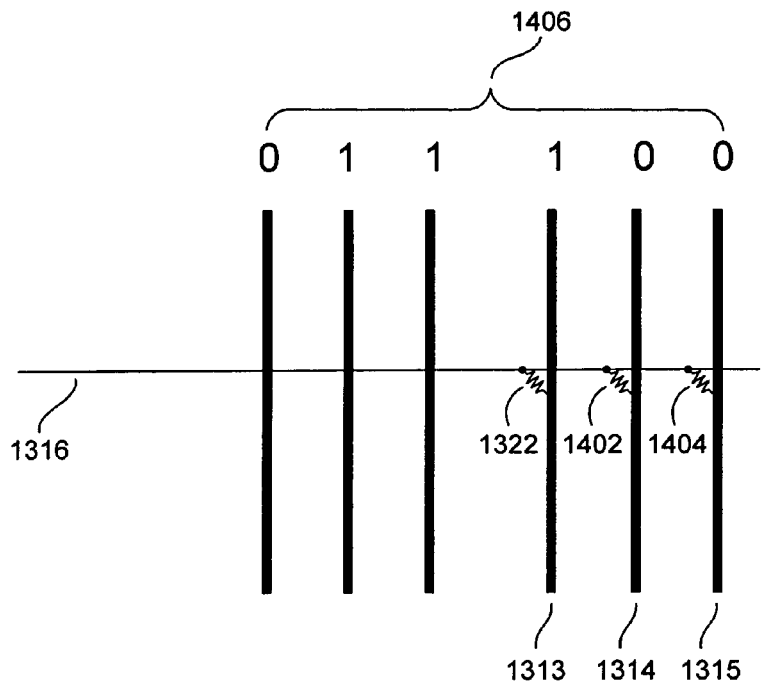
FIGS. 14A-B illustrate a voltage-divider-based determination of the voltage output to a nanowire from a microscale/nanoscale encoder-demultiplexer.
Figure 14B:
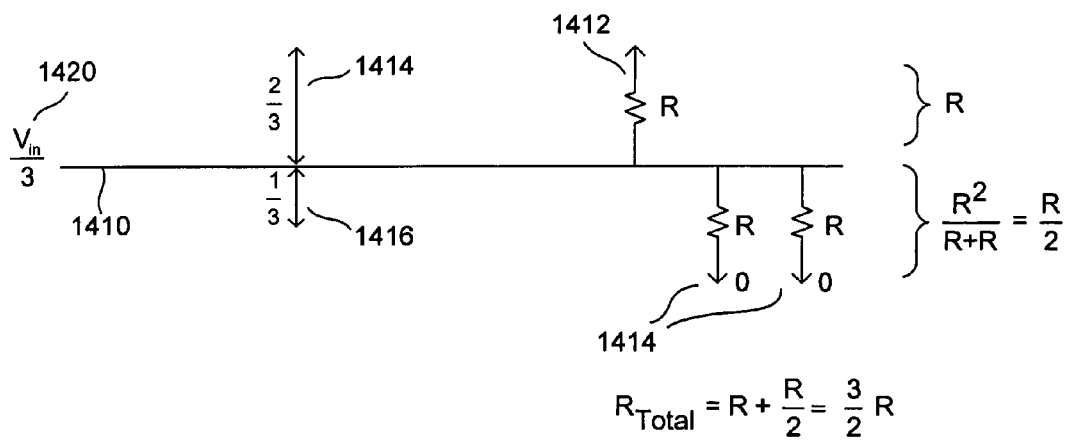

The pattern of voltages output to a particular nanowire by the encoder-demultiplexer upon input of a particular address a to the encoder results from a voltage-divider effect. FIGS. 14A-B illustrate a voltage-divider-based determination of the voltage output to a nanowire from a microscale/nanoscale encoder-demultiplexer. FIG. 14A shows nanowire 1316 with resistive interconnections 1322, 1402, and 1404 to microscale output signal lines 1313-1315. In FIG. 14A, the pattern of voltages output by the encoder to the microscale output signal lines are shown as numeric binary values "0" and "1" above the microscale output signal lines 1406. Considering the voltage corresponding to binary value "1" as 1V, also referred to below as the source voltage, and the voltage corresponding to binary output value "0" as ground, also referred to below as the sink voltage, the nanowire 1316 can be viewed as a voltage divider 1410. The microscale output signal lines carrying a "1" output, and interconnected to the nanowire through a resistive connection, can be considered to be a parallel set of interconnections, through resistors of a common resistance R, between the nanowire 1410 and the source voltage source 1412. The microscale output signal lines carrying a "0" output, and interconnected to the nanowire through a resistive connection, can be considered to be a parallel set of interconnections, through resistors of a common resistance R, between the nanowire 1410 and ground 1414. In other words, the resistance of all interconnections between the microscale output signal lines and the nanowire are considered, for purposes of analyzing the output voltages, to be identical. Also, when there is no interconnection between the nanowire and a microscale output signal line, the resistance is considered to be essentially infinite, with no electrical connection between the nanowire and microscale output signal line. In the specific case shown in FIGS. 14A-B, the single microscale output signal line carrying a signal "1" 1313 corresponds to a single interconnection, through resistance R, of the nanowire 1410 to the source voltage, and the two microscale output signal lines 1314 and 1315 carrying an output signal of "0" correspond to two interconnections 1414 of the nanowire 1410 to ground through parallel resistors of resistance R. The total resistance of the interconnections of the nanowire to the source voltage is R, and the total resistance of the parallel interconnections of the nanowire to ground is $$\frac{R}{2}.$$

According to the voltage-divider equations, two thirds of the voltage drop between the source voltage and ground occurs between the voltage source and the nanowire 1414, and one third of the voltage drop occurs between the nanowire and ground 1416. Thus, the voltage output to the voltage-divider nanowire 1410 is $$\frac{V}{3}.$$

Figure 15:
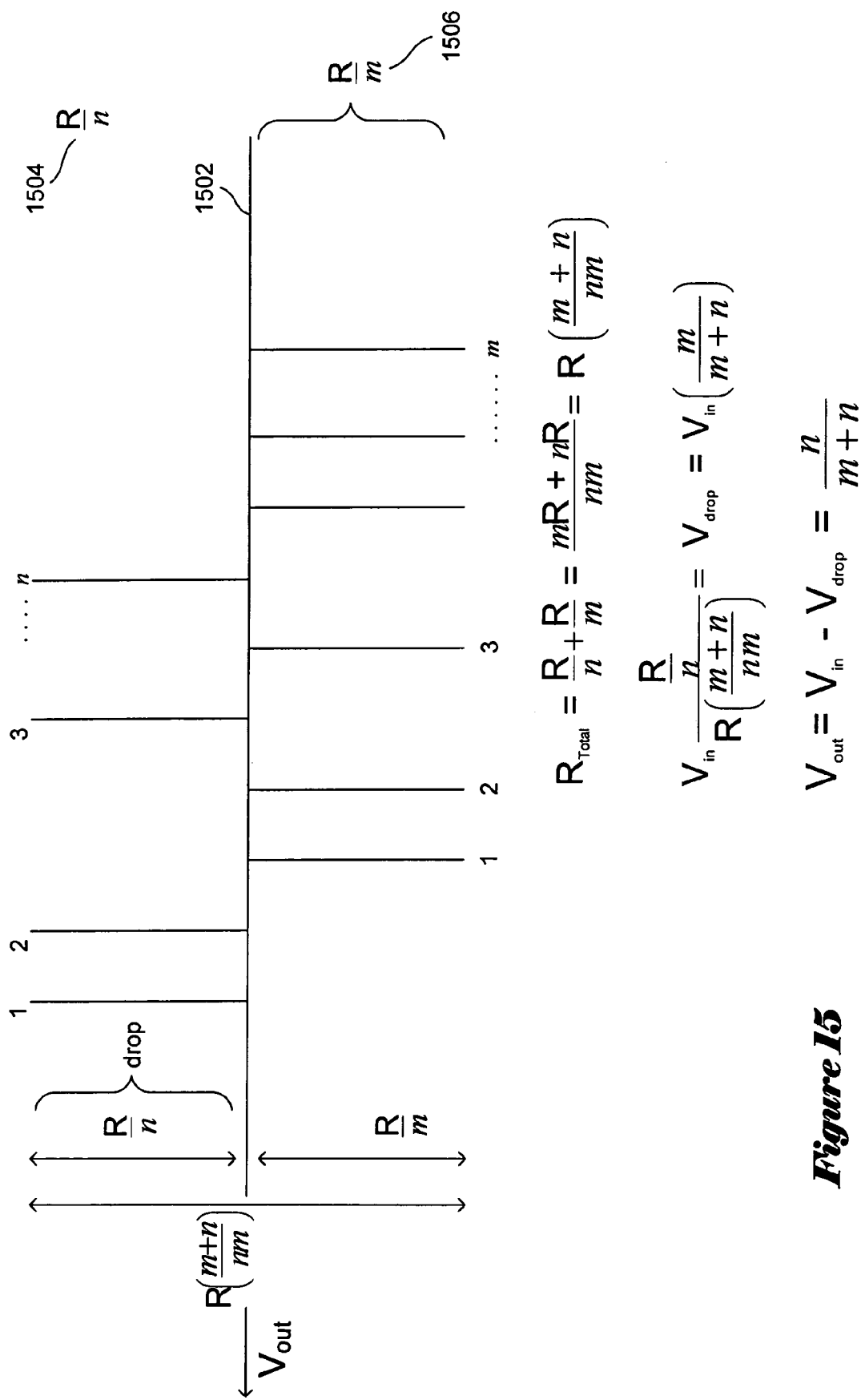
FIG. 15 illustrates a general voltage-divider-based analysis of the voltage output to a nanowire from a microscale/nanoscale encoder-demultiplexer.

FIG. 15 illustrates a general voltage-divider-based analysis of the voltage output to a nanowire from a microscale/nanoscale encoder-demultiplexer. As shown in FIG. 15, when n microscale output signal lines, interconnected to the nanowire through resistive junctions, carry a "1" voltage signal, and m microscale output signal lines, interconnected to the nanowire through resistive junctions, carry a "0" voltage signal, the total resistance between the voltage source and the nanowire voltage divider 1502 is $$\frac{R}{n}$$

1504, and the total resistance between the nanowire voltage divider 1502 and ground is $$\frac{R}{m}$$

1506. Therefore, the voltage produced on the nanowire voltage divider, $V_{out}$, equals $$\left(\frac{n}{m+n}\right)V_{in}.$$

It is convenient to discuss the output voltages on nanowires in terms of normalized voltages, which range from 0V to 1V. The normalized voltage v for a given nanowire, when n microscale output signal lines, interconnected to the nanowire through resistive junctions, carry a "1" voltage signal, and m microscale output signal lines, interconnected to the nanowire through resistive junctions, carry a "0" voltage signal, therefore is $$\frac{n}{m+n}.$$

Figure 16A:
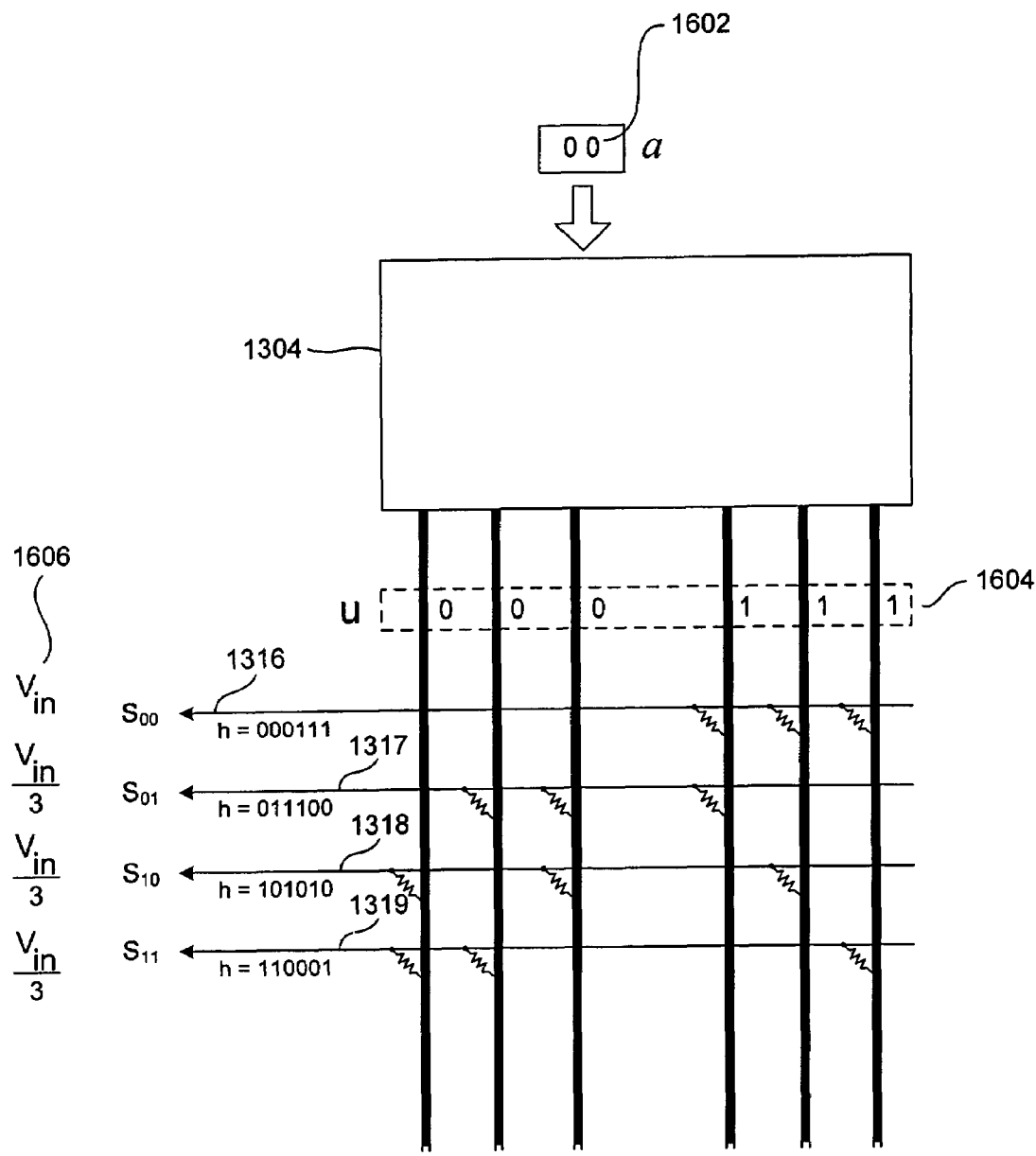
FIGS. 16A-D illustrate, using the same illustration conventions as used in FIG. 13, the pattern of voltages output on the nanowires of a microscale/nanoscale demultiplexer crossbar when different addresses a are input to the encoder of the microscale/nanoscale encoder-demultiplexer.
Figure 16B:
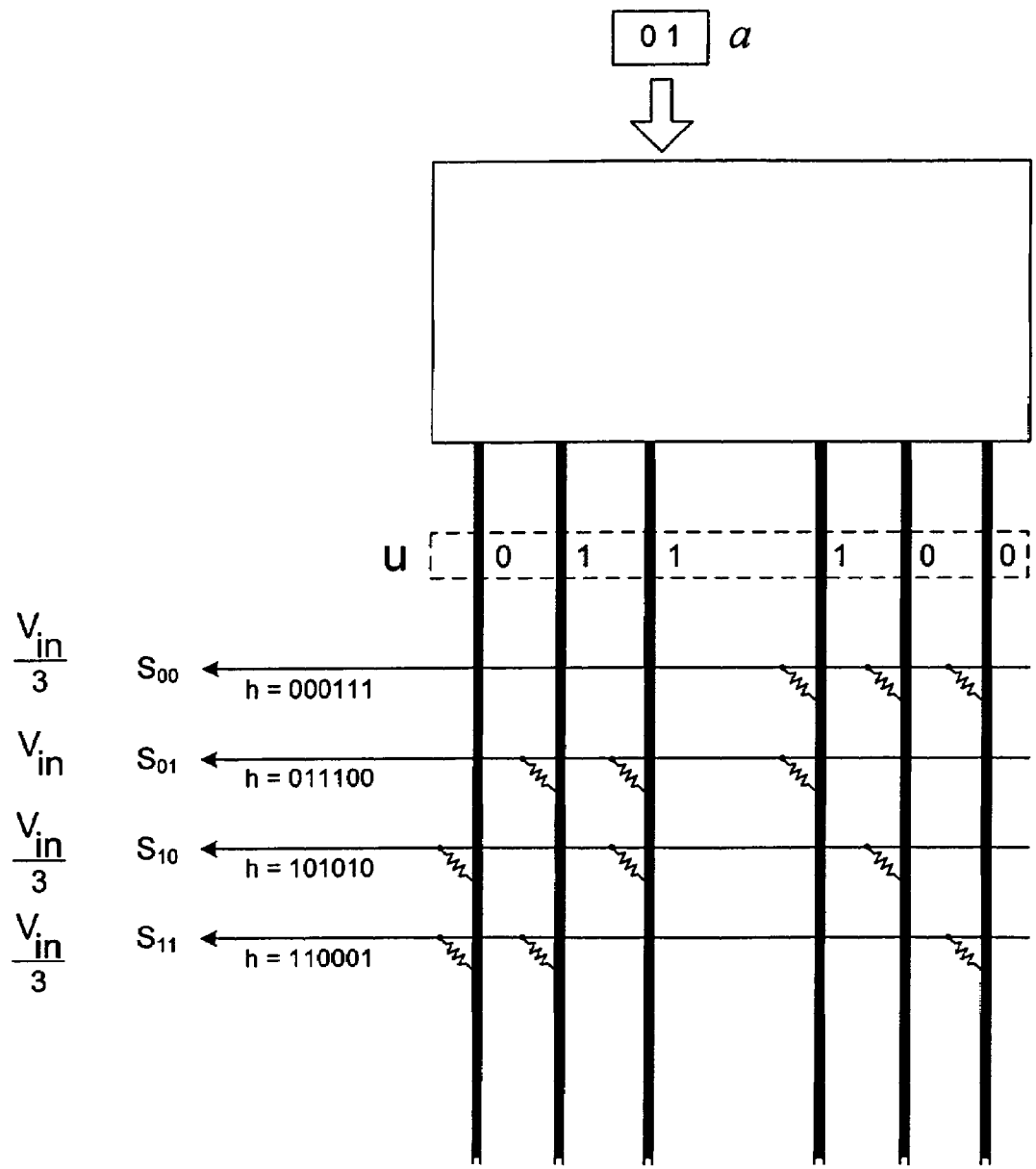
Figure 16C:
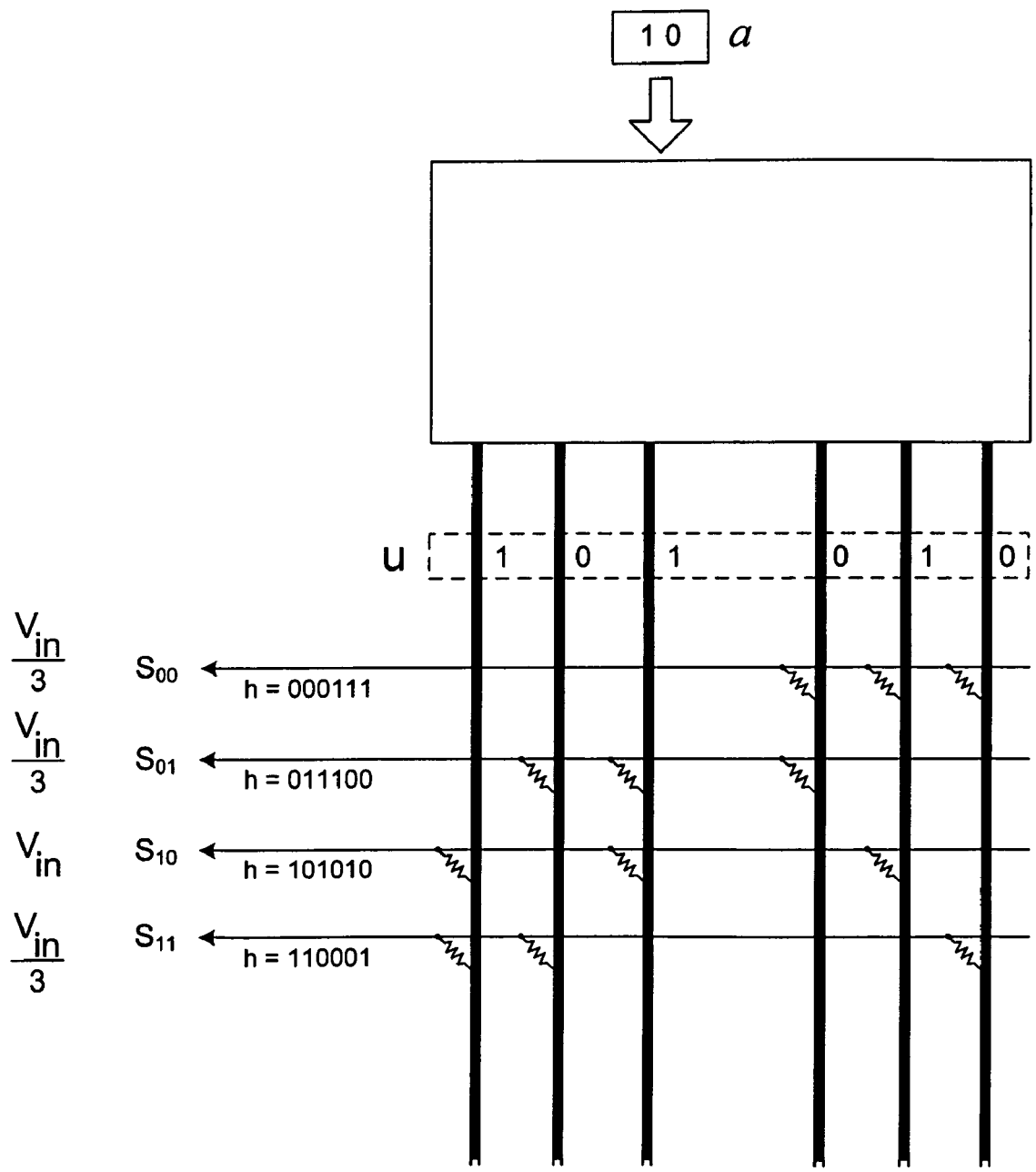
Figure 16D:
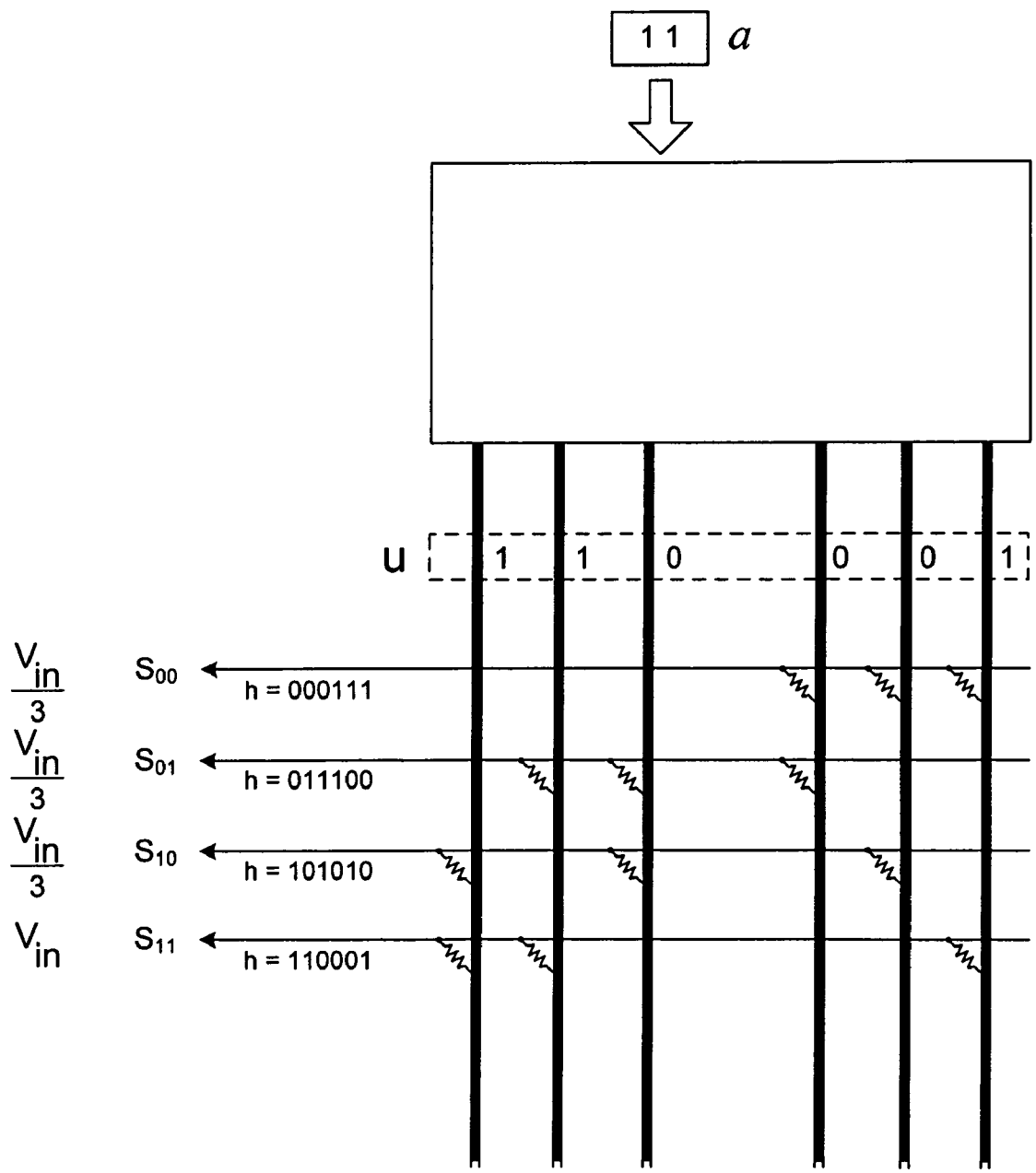

FIGS. 16A-D illustrate, using the same illustration conventions used in FIG. 13, the pattern of voltages output on the nanowires of a microscale/nanoscale encoder-demultiplexer crossbar when different external addresses a are input to the encoder. For example, as shown in FIG. 16A, input of the external address "00" 1602 results in output, from the encoder 1304, of the code word "000111" 1604 which, in turn, produces the voltage pattern shown in column 1606 on the four nanowires 1316-1319. Not surprisingly, the nanowire $S_{00}$ with internal nanowire address h equal to 000111, identical to the output code word u 000111 (1604 in FIG. 16), carries the highest output voltage, while the remaining, unselected nanowires 1317-1319 carry substantially less output voltage. Each input address a selects a particular nanowire by placing a larger voltage on the selected nanowire than on the remaining nanowires. FIGS. 16B-D show the output voltage patterns corresponding to input addresses "01," "10," and "11," respectively.

Figure 17:
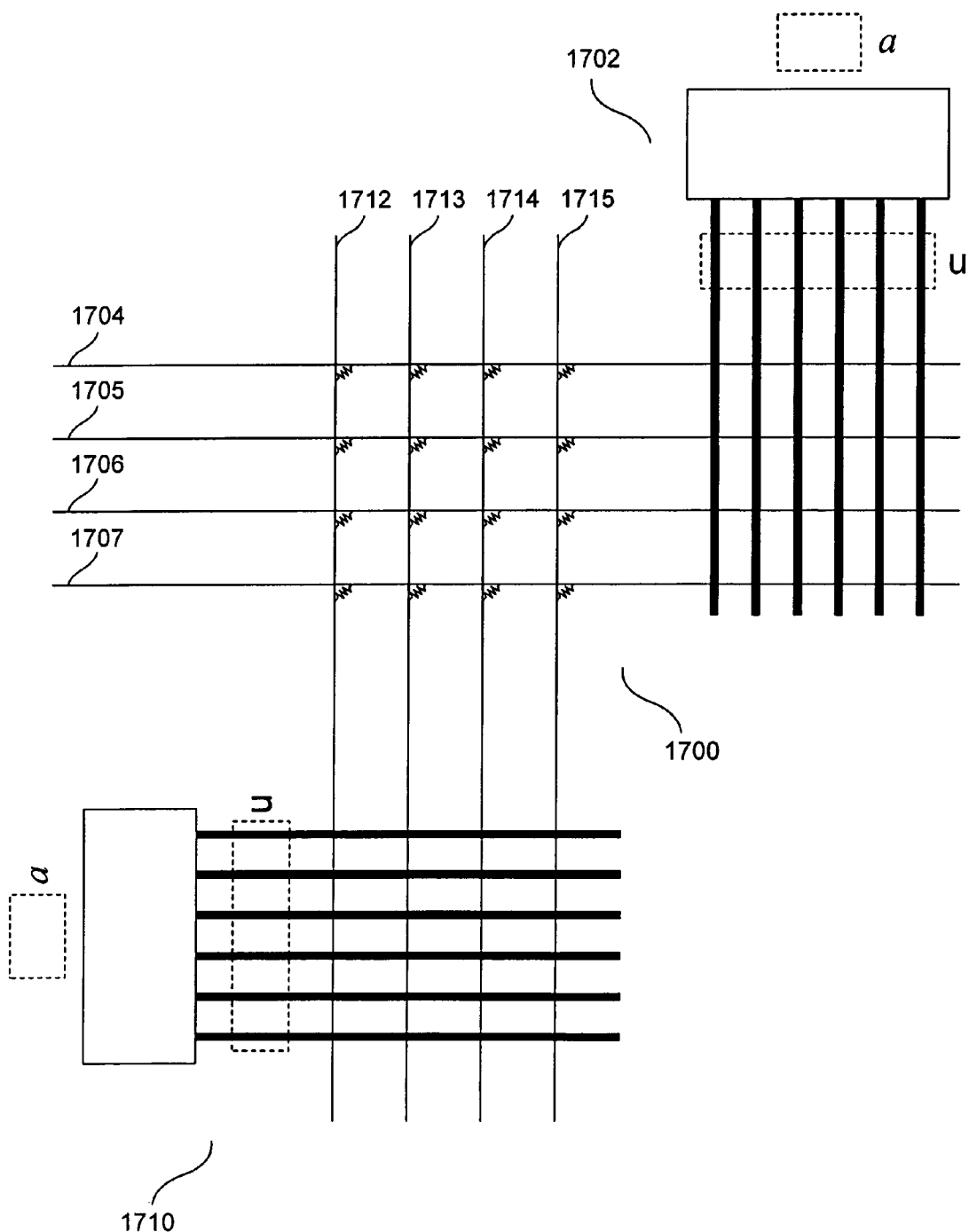
FIG. 17 shows a 16-element nanoscale memory array addressed by two microscale/nanoscale encoder-demultiplexers.
Figure 18:
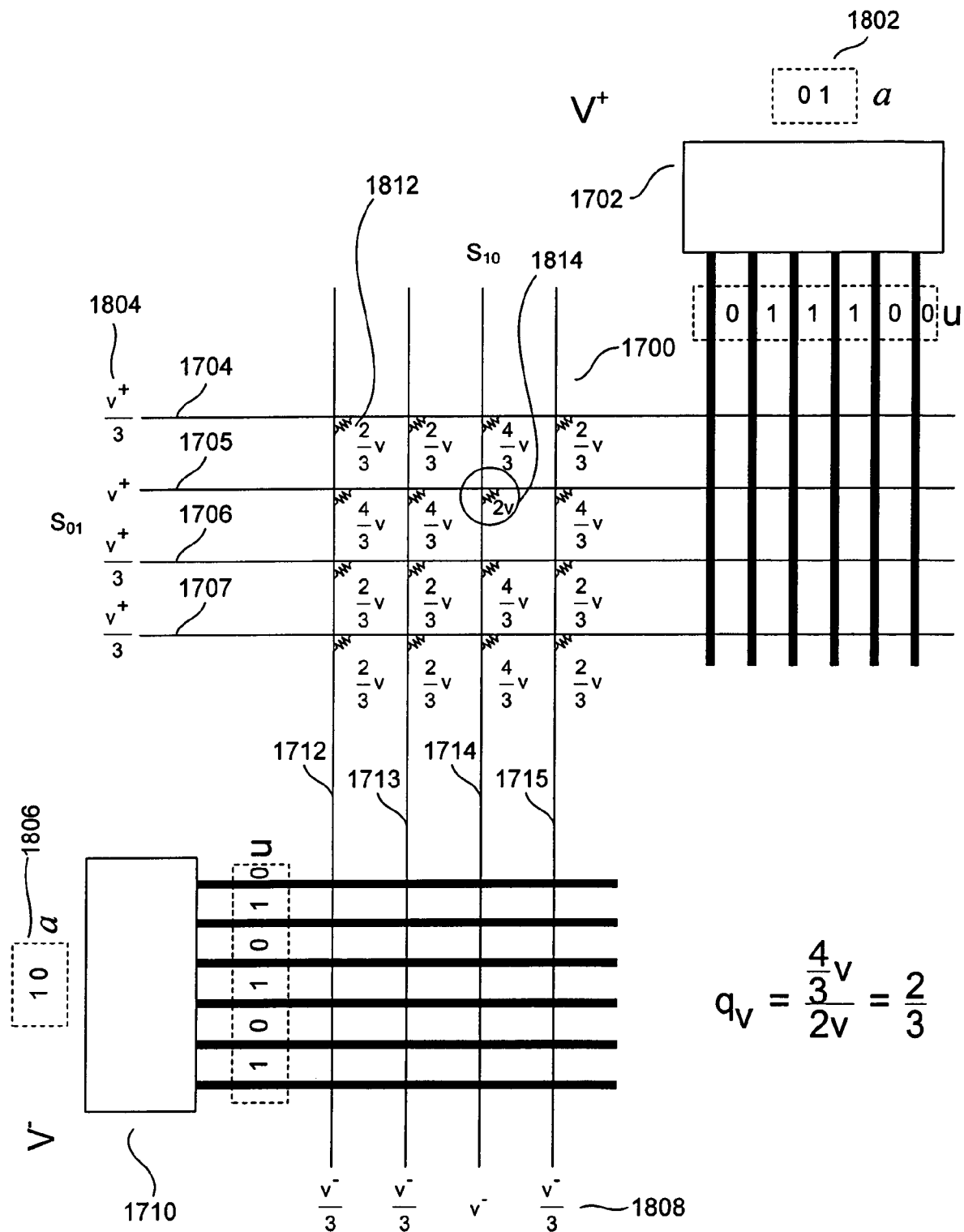
FIG. 18 illustrates selection of a specific nanowire-crossbar junction within a nanoscale memory array by input of two addresses to the two microscale/nanoscale encoder-demultiplexers.

FIG. 17 shows a 16-element nanoscale memory array addressed by two microscale/nanoscale endcoder-demultiplexers. As shown in FIG. 17, a first microscale/nanoscale encoder-demultiplexer 1702 outputs voltage patterns, or code words, to a first set of parallel nanowires 1704-1707, and a second microscale/nanoscale encoder-demultiplexer 1710 outputs voltage patterns to a second set of parallel nanowires 1712-1715. FIG. 18 illustrates selection of a specific nanowire-crossbar junction within a nanoscale memory array by input of two external addresses to the two microscale/nanoscale encoder-demultiplexers. The first microscale/nanoscale encoder-demultiplexer 1702 is driven by a voltage source of +1V, and the second microscale/nanoscale encoder-demultiplexer 1710 is driven by a source voltage of –1V. Both microscale/nanoscale encoder-demultiplexers have voltage sinks of 0V. Input of the address "01" 1802 to the first encoder-demultiplexer 1702 produces a voltage pattern shown in column 1804 on the first set of nanowires 1704-1707. Input of the address "10" 1806 to the second encoder-demultiplexer 1710 produces the voltage pattern in row 1808 on the second set of parallel nanowires 1712-1715.

The voltage drop across each nanowire-crossbar junction between each pair of nanowires in the 16-bit nanoscale memory array 1700 can be computed as the difference in the voltage output on the first nanowire of the pair, from the first set of parallel nanowires 1704-1707, and the voltage output on the second nanowire of the pair, from the second set of parallel nanowires 1712-1715. The voltage drops across each junction are shown in FIG. 18. For example, the voltage drop $$\frac{2}{3}V$$

across nanowire-crossbar junction 1812 is computed as the voltage output on nanowire 1704, $$\frac{V}{3},$$

minus the voltage output on nanowire 1712, $$-\frac{V}{3}.$$

The subtraction $$\frac{V}{3} - \frac{V}{3}$$

produces the result $$\frac{2}{3}V,$$

the voltage drop shown for junction 1812. As can be seen in FIG. 18, a single junction 1814, circled in FIG. 18, has a relatively high voltage drop of 2V, while the remaining voltage drops across the remaining junctions range from $$\frac{2}{3}V$$

to $$\frac{4}{3}V.$$

The selected nanowire-crossbar junction is the nanowire-crossbar junction between the nanowire 1705 selected by the first encoder-demultiplexer 1702 and the nanowire 1714 selected by the second encoder-demultiplexer 1710.

As discussed in the previous subsection, the resistance state of a hysteretic resistor can be set by application of an appropriate, relatively high-voltage drop of a particular polarity. However, should a voltage drop exceed the destruction voltage for a junction, the junction is destroyed. Thus, in order to effect a WRITE operation, the two encoder-demultiplexers need to produce a voltage across the selected memory element ([$S_{01},S_{10}$] in the example of FIG. 18) of sufficient magnitude to change the specific resistance state of the junction, but smaller in magnitude than the destruction voltage that would destroy the junction, or, in other words, the two encoder-demultiplexers need to produce a WRITE-access voltage across the selected memory element within a WRITE-access voltage range greater than the WRITE threshold and less than the destruction threshold. The nanoscale memory array generally operates by writing and reading a single junction at a time, although row-wide and column-wide operations may also be feasible. In order to carry out a WRITE operation on a single memory element, the encoder-demultiplexers need to place a WRITE-access voltage across the selected nanowire-crossbar junction and voltage drops less than the threshold WRITE voltage across all non-selected junctions.

In the case shown in FIG. 18, if the destruction voltage threshold is 2.5 volts, and the threshold resistance-state-change voltage is 1.5 volts, then the illustrated application of a 2V drop across the selected nanowire-crossbar junction [$S_{01},S_{10}$] will set the selected nanowire-crossbar junction to a particular resistance state, or binary value, while the remaining nanowire-crossbar junctions will not be affected, and, importantly, no nanowire-crossbar junction will be destroyed. A parameter that can be used to characterize any addressing scheme, including the addressing scheme shown in FIG. 18, is the ratio $q_v$, equal to the largest voltage drop produced across an unselected junction divided by the voltage drop produced across the selected junction. The ratio $q_v$ is independent of normalization, or scaling, of the driving voltages of the encoder-demultiplexers. In the specific example shown in FIG. 18, the ratio $q_v$ is equal to $$\frac{2}{3}.$$

The smaller the ratio $q_v$, the better the differentiation in voltage drops between selected junctions and non-selected junctions. The normalized voltage margin $v_m$ for the addressing scheme is $1-q_v$, or, in the case shown in FIG. 18, $$\frac{1}{3}.$$

The normalized voltage margin $v_m$ is the normalized difference in voltage between the voltage state of the selected junction and the voltage state of the non-selected junction with the highest voltage drop. Thus, in the example shown in FIG. 18, a normalization factor of $$\frac{1}{2}$$

applied to the absolute voltage margin of $$2V - \frac{4}{3}V = \frac{2}{3}V$$

produces a normalized voltage margin of $$\frac{1}{3}.$$

As discussed above, the normalized voltage v output to a given nanowire by an encoder-demultiplexer is equal to:

$$v = \frac{n_{ones}}{n_{ones} + n_{zeroes}}$$

For a constant-weight-code-based encoder in an encoder-demultiplexer of the present invention, the normalized voltage $v_h$ output to nanowire $S_h$ can be expressed as follows:

$$V_h = \frac{w(u \text{ AND } h)}{w(h)}$$

where AND is a bitwise logical AND operation;
u is the code word output by the encoder-demultiplexer; and
h is the internal nanowire address of nanowire $S_h$.

The weight of the intersection u AND h, w(u AND h), is the number of interconnections between microscale output signal lines carrying "1" signals and the nanowire. The weight of the internal nanowire address, w(h), is the total number of interconnections between the nanowire and microscale output signal lines.

Figure 19:
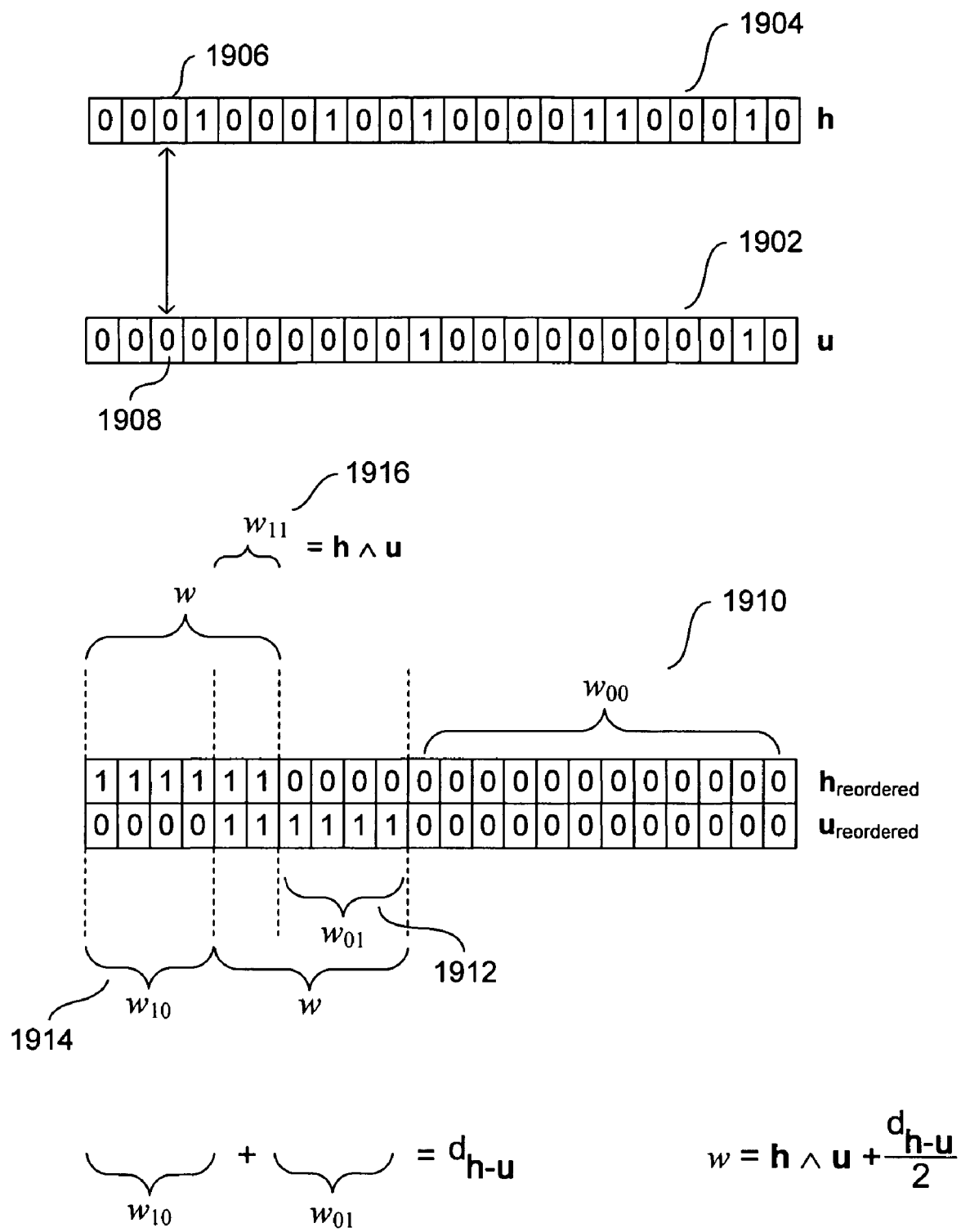
FIG. 19 illustrates sorting of paired bits of a code word u and internal nanowire address h into sets w00, w01, w10, and w11.

Given a code word u and an internal nanowire address h, the corresponding bit pairs of the code word u and the nanowire address h can be sorted into four different categories, each category representing a different two-bit value:

$w_{11} = w(u \text{ AND } h)$ $w_{10} = w(u \text{ AND } \bar{h})$ $w_{01} = w(\bar{u} \text{ AND } h)$ $w_{00} = w(\bar{u} \text{ AND } \bar{h})$ Considering the bit pairs to be two-bit integers, with the least significant bit of the bit pair taken from the internal nanowire address h, the bit-pair groupings can be considered to partitioning the bit-pairs into bit pairs with the following integer values:

value of bit pairs in $w_{11} = 3$
value of bit pairs in $w_{10} = 2$
value of bit pairs in $w_{01} = 1$
value of bit pairs in $w_{00} = 0$ FIG. 19 illustrates sorting of paired bits of a code word u and nanowire-selection voltage pattern h into sets w00, w01, w10, and w11. In FIG. 19, the code word u 1902 and the nanowire address h 1904 are both shown as vectors of binary values "0" and "1," aligned so that a binary value in a particular position of the nanowire address 1904 corresponds to a binary value in an equivalent position of the code word 1902. For example, binary value "0" in the third position 1906 of the nanowire address 1904 corresponds to binary value "0" in the third position 1908 of the code word 1902. The bit pairs can then be sorted into the four sets $w_{00}$ 1910, $w_{01}$ 1912, $w_{10}$ 1914, and $w_{11}$ 1916 by rearranging the bit pairs in order to coalesce bit pairs with the same value together into 4 groups. It can be readily observed that the distance between the internal nanowire address and the code word, $d_{h-u}$, can be expressed as:

$$d_{h-u} = d_{u-h} = w(u \text{ XOR } h) = w_{10} + w_{01}$$

Moreover, the weight of the code word and nanowire address w can be expressed as:

$$w_h = w(h) = w_{10} + w_{11}$$

$$w_u = w(u) = w_{01} + w_{11}$$

Since both h and u are code words of a constant-weight code:

$$w_h = w_u$$

Therefore:

$$w_{10} + w_{11} = w_{01} + w_{11}$$

$$w_{10} = w_{01}$$

-continued $$d_{h-u} = d_{u-h}$$
$$= w(uXOR = h)$$
$$= w_{10} + w_{01}$$
$$= w_{10} + w_{10}$$
$$= w_{01} + w_{01}$$

and, finally:

$$w_{10} = \frac{d_{h-u}}{2}$$

$$w_{01} = \frac{d_{h-u}}{2}$$

Defining the intersection $i_{u-h}$ as:

$$i_{u-h} = w(u \text{ AND } h) = w_{11}$$

the weight w of a constant-weight code is:

$$w = i_{u-h} + \frac{d_{h-u}}{2}$$

The distance d between code words in a constant-weight code is always even, and so $$\frac{d_{h-u}}{2}$$

is always an integer. By combining the above equations, an expression for the voltage $v_h$ output on a nanowire with internal nanowire address h, when the encoder-demultiplexer outputs the code word u to the microscale output signal lines, can be expressed as:

$$v_h = \frac{i_{u-h}}{w} = \frac{w - \frac{d_{h-u}}{2}}{w} = 1 - \frac{d_{h-u}}{2w}$$

Note that, since the distance between code words of a constant-weight code falls in the interval [0,2w], the normalized voltage output $v_h$ falls within the interval [0,1], according to the above equation.

The linear relationship between the output voltage $v_h$ and the distance between the output code word and nanowire addresses u and h can be transformed into a vector equation:

$$v = 1 - \frac{d}{2w}$$

where v is a vector of the possible output voltages for nanowires addressed by an encoder-demultiplexer, in descending order; and d is a distance-profile vector containing the possible distances between code words in the constant-weight code in ascending order.

FIG. 20 graphically illustrates a vector equation for determining a possible-output-voltages vector v. FIG. 21 illustrates deriving the possible-output-voltages vector v from the constant-weight code employed in the exemplary encoder-demultiplexer of FIGS. 13 and 16A-D. In FIG. 21, table 2102 lists the possible distances between code words in the code employed in the encoder-demultiplexer. These values generate the distance-profile vector d 2104, and simple arithmetic operations lead to the result 2106, a possible-output-voltages vector v that lists the two different normalized output voltages 1 and 1/3 observed for the encoder-demultiplexer in FIGS. 16A-D.

While the above vector equation produces a vector of possible normalized output voltages, a vector of absolute output voltages $v_{abs}$ can be similarly derived for using the normalized possible-output-voltages vector v and non-normalized source $v_{high}$ and sink $v_{low}$ voltages as follows:

$$v_h = (v_{high} - v_{low})v_h + v_{low}$$

$$v_{abs} = (v_{high} - v_{low})\left(1 - \frac{d}{2w}\right) + v_{low}$$

The above vector equations for computing the vector of normalized, possible output voltages from a distance profile of a constant-weight code of weight w can be applied to a specific, exemplary constant-weight code. FIG. 22 shows the distance profile of an (11,66,4,5) constant-weight code. As can be seen in FIG. 22, the distance profile features four different possible code-word distances for code words of the (11,66,4,5), constant-weight code: 4 (2202 in FIG. 22); 6 (2204 in FIG. 22); and 8 (2206 in FIG. 22); and the trivial distance 0 (2208 in FIG. 22) between any code word and itself. Using the vector equation for computing normalized, possible-output-voltages vectors, a normalized, possible-output-voltages vector v for the (11,66,4,5) constant-weight code can be easily computed.

Figure 23:
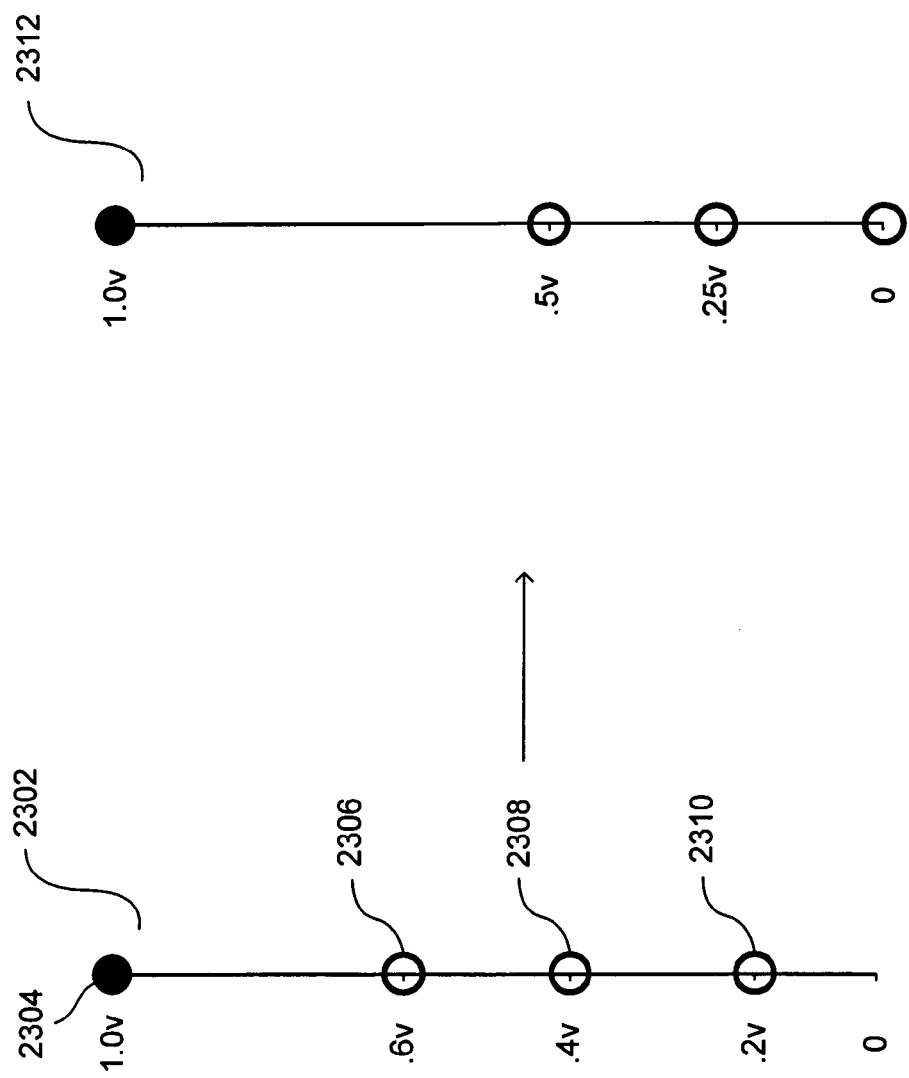
FIG. 23 shows a normalized, possible-output-voltages vector for the (11,66,4,5) constant-weight code, and a related re-normalized-output-voltages vector.

FIG. 23 shows a normalized, possible-output-voltages vector for the (11,66,4,5) constant-weight code, and a related re-normalized-output-voltages vector. The vectors are shown diagrammatically, with possible output voltage values along a vertical voltage interval. The first vector 2302 shown in FIG. 23 corresponds to normalized voltages in the range [0,1]. The filled circle 2304 corresponds to the voltage output on a selected nanowire, for which the distance between the internal nanowire address h and the code word u output by the encoder-demultiplexer is 0. The first unfilled circle 2306 corresponds to the voltage output on a non-selected nanowire with an address h that is at a distance of $d_{min}$, or 4, from u. The second unfilled circle 2308 corresponds to the voltage output on a non-selected nanowire with an internal address h at an intermediate distance of 6 from the code word u output by the encoder-demultiplexer. Finally, open circle 2310 corresponds to the voltage output on a non-selected nanowire with an address h at a distance $d_{max}$, or 8, from the code word u output by the encoder-demultiplexer.

The second vector 2312 diagrammatically displayed in FIG. 23 is produced by re-normalizing the first, normalized-output-voltage vector 2302. The re-normalization is carried out by rescaling the encoder-demultiplexer's source and sink voltages as follows:

$$v_{high} = 1$$

$$v_{low} = 1 - \frac{2w}{d_{max}}$$

Substituting these values for the source and sink voltages into the original vector equation, described above, produces a second vector equation:

$$v = 1 - \frac{d}{d_{max}}$$

The second, re-normalized vector 2312 in FIG. 23 is produced by application of this newly derived vector equation to the distance-profile vector for the (11,66,4,5) constant-weight code.

Making a number of assumptions that allow for relatively straightforward characterization of the electrical properties of a nanoscale memory array, optimality criteria can be determined for voltage margins with respect to the error-control code on which encoder-demultiplexers are based. In the following, it is assumed that both encoder-demultiplexers in an analyzed nanoscale memory array employ the same constant-weight code. The polarities of the two encoder-demultiplexers are assumed to be opposite from one another, so that a nanowire selected by the first encoder-demultiplexer has a highest possible voltage with respect to a nanowire selected by the second encoder-demultiplexer, in order to provide as great a voltage drop as possible across the selected nanowire-crossbar junction. The differences between the source and sink voltages of both encoder-demultiplexers is assumed to be identical, and dictated by the WRITE-voltage thresholds of the hysteretic-resistor nanowire-crossbar junctions of the nanowire crossbar memory array. It is assumed that the resistors in the microscale/nanoscale demultiplexer crossbars are linear, that the configured resistors all have the same resistance R, and that the non-configured junctions in the microscale/nanoscale demultiplexer crossbar behave as open switches, or, in other words, have infinite resistance. The microscale output signal lines and nanowires of the microscale/nanoscale demultiplexer crossbars are assumed to have negligible resistance, and the voltage sources driving the encoder-demultiplexers are assumed to remain constant under load. The hysteretic resistors in the memory array are assumed to be identical and have identical physical and electronic characteristics, including identical WRITE-access thresholds and destruction thresholds.

Figure 24:
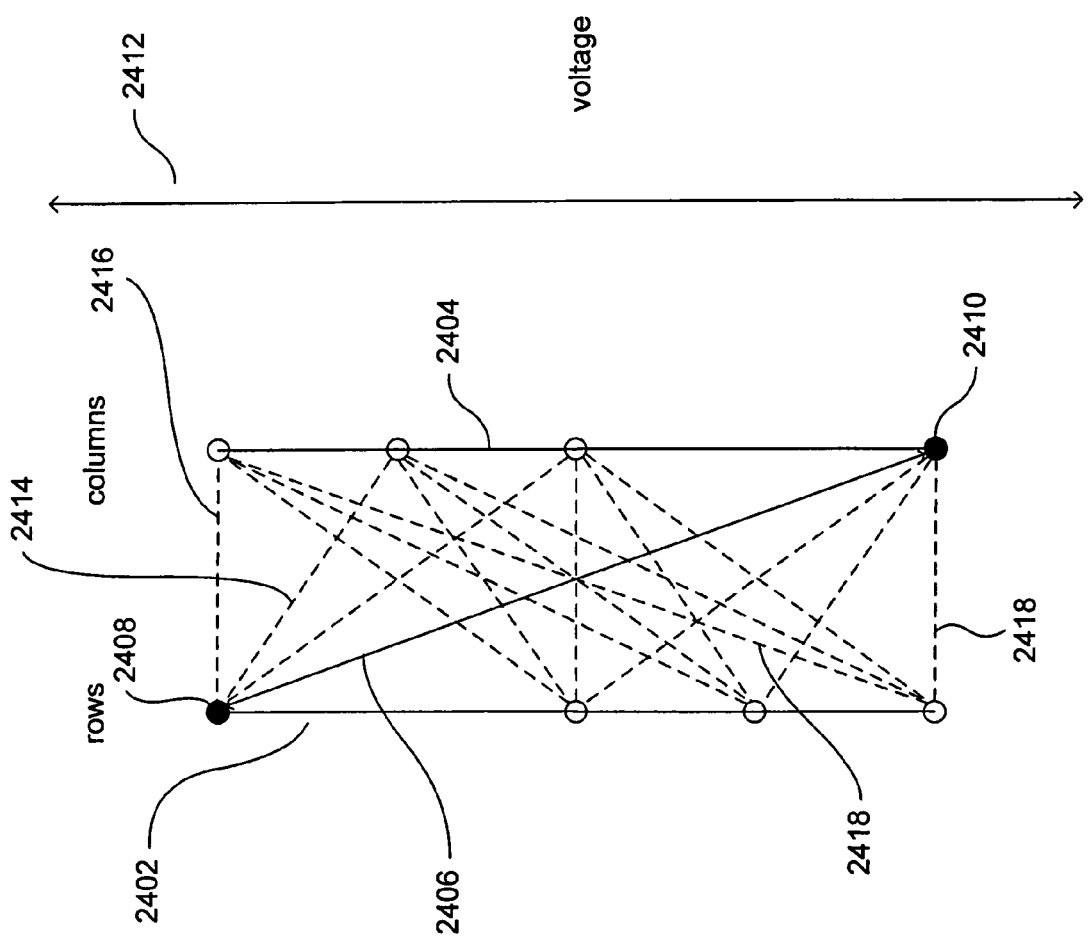
FIG. 24 illustrates a simple graphical representation of the possible voltage drops produced across junctions of a nanoscale memory array addressed by two constant-weight-code-based encoder-demultiplexers.

The voltage margin produced in a nanoscale memory array, and the pattern of voltages produced for selected and non-selected junctions within the nanoscale memory array resulting from using a particular constant-weight code, can be graphically visualized for various voltage offsets t between the source and sink voltage range of the first encoder-demultiplexer and the source and sink voltage range of the second demultiplexer. FIG. 24 illustrates a simple graphical representation of the possible voltage drops produced across nanowire-crossbar junctions of a nanoscale memory array addressed by two constant-weight-code-based encoder-demultiplexers. FIG. 24 uses the specific example of encoder-demultiplexers based on the above-described (11,66,4,5) constant-weight code. The voltages output to the row nanowires of the nanoscale memory array are controlled by a first encoder-demultiplexer with a re-normalized possible-output-voltages vector 2402. Note that this re-normalized possible-output-voltages vector is identical to re-normalized possible-output-voltages vector 2312 shown in FIG. 23 and described with reference to FIG. 23. The voltages output to column nanowires of the nanoscale memory array are controlled by a second encoder-demultiplexer with inverted polarity, the possible-output-voltages vector for which 2404 is displaced to the right from the possible-output-voltages vector 2402 for the row-controlling encoder-demultiplexer. The possible-output-voltages vector 2404 for the column-controlling encoder-demultiplexer is inverted with respect to the possible-output-voltages vector 2312 in FIG. 23, to reflect the fact that the second encoder-demultiplexer controlling the column nanowires of the nanoscale memory array has inverted polarity with respect to the first encoder-demultiplexer controlling the row nanowires of the nanoscale memory array. The bold, double-arrowed line 2406 connects the selected-nanowire output voltage 2408 of the first encoder-demultiplexer with the selected-nanowire output voltage 2410 of the second encoder-demultiplexer. The vertical distance between selected output voltages 2408 and 2410, equal to the length of either of the two re-normalized possible-output-voltages vectors 2402 and 2404, is equal to the voltage drop produced across a selected nanowire-crossbar junction in a nanoscale memory array controlled by the encoder-demultiplexers described by possible-output-voltages vectors 2402 and 2404, aligned with respect to absolute voltage 2412 as shown in FIG. 24. The dashed lines, such as dashed line 2414, show all possible non-selected voltage drops. In all cases, the voltage drop produced at a corresponding nanoscale memory array junction equals the vertical distance between the voltage levels of the two output voltages interconnected by the dashed line. For example, in the alignment shown in FIG. 24, in which the source voltage of the first encoder-demultiplexer is equal to the sink voltage of the second encoder-demultiplexer, and the sink voltage of the first encoder-demultiplexer is equal to the source voltage of the second encoder-demultiplexer, the voltage drop across a junction interconnected by a selected row nanowire and the lowest-voltage unselected column nanowire, represented by dashed lines 2416 and 2418, are both zero. By contrast, the voltage drop across the lowest-voltage unselected row nanowire and the highest-voltage unselected column nanowire, represented by dashed line 2418, is equal in magnitude, but opposite in polarity, from the voltage drop across a selected nanowire-crossbar junction, described by the filled circles 2408 and 2410 interconnected by line 2406. In FIG. 24, the polarity of a voltage drop represented by a voltage state on the first re-normalized possible-output-voltages vector 2402 connected to a second voltage state on the second re-normalized possible-output-voltages vector 2404 corresponds to the sign of the slope of the line interconnecting the first and second voltage states.

FIGS. 25A-D illustrate determination of an optimal voltage offset t for paired, constant-weight-code-based encoder-demultiplexers. FIGS. 25A-D show a series of diagrams, such as diagram 2502 in FIG. 25A, similar to the above-described construction presented in FIG. 24. However, unlike in FIG. 24, the second re-normalized possible-output-voltages vector 2402 is offset vertically with respect to the first re-normalized possible-output-voltages vector 2402 by a voltage offset t. The offset t is steadily increased from the −1 offset shown in diagram 2502 in FIG. 25A to the final diagram shown in FIG. 25D, in which t is +1. The diagrams in FIGS. 25A-D are intended to show how the voltage margin, or difference between the voltage dropped across the selected nanowire-crossbar junction and the voltage dropped across the non-selected nanowire-crossbar junction with the largest voltage drop, varies with respect to the voltage drop t.

Initially, with t=−1 in diagram 2502, the voltage dropped across the selected nanowire-crossbar junction is 0, indicated by horizontal line 2506. By contrast, the voltage dropped across the lowest-voltage non-selected nanowire of the first encoder-demultiplexer and highest-voltage non-selected nanowire of the second encoder-demultiplexer, the vertical distance between the voltage states connected by dashed line 2508, is of large magnitude. In this case, the ratio $q_v$ is essentially infinite, and the voltage margin is essentially infinitely negative. In this case, the nanoscale memory array cannot operate as intended. As the voltage offset t increases, through the left-to-right series of diagrams in FIGS. 25A-D, a diagram is reached (2510 in FIG. 25B) where the voltage margin is positive. This diagram corresponds to the first operable nanoscale memory array. The voltage offset t 2512 is slightly positive for the first operable nanoscale memory array. Continuing rightward, the next diagram (2518 in FIG. 25C) shows a nanoscale memory array with an even better, positive voltage margin resulting from additional separation between the voltage dropped across the selected nanowire-crossbar junction and the voltage dropped across the non-selected nanowire-crossbar junction with greatest voltage drop. Continuing to the next diagram (2520 in FIG. 25C), a crossover has occurred, with the voltage dropped across the non-selected nanowire-crossbar junctions with greatest voltage drop is now the voltage states interconnected by dashed lines 2526 and 2528. The vertical distance between the voltage states interconnected by these dashed lines is now greater than the voltage dropped across the nanowire-crossbar junction between the lowest-voltage row nanowire and the highest voltage column nanowire. Dashed line 2526 indicates the difference between the voltage state of the selected row nanowire 2522 and the lowest-voltage non-selected column nanowire 2521. Dashed line 2528 indicates the difference between the voltage state of the selected column nanowire 2530 and the highest-voltage non-selected row nanowire 2532. Note that the discussion concerns only voltage-drop magnitudes, rather than signed voltage drops, and assumes that the voltage thresholds for WRITE-access for both polarities are of equal magnitude. Removing these assumptions would shift the absolute optimal voltage offset t, but not the optimization criteria that are described below.

Figure 25A:
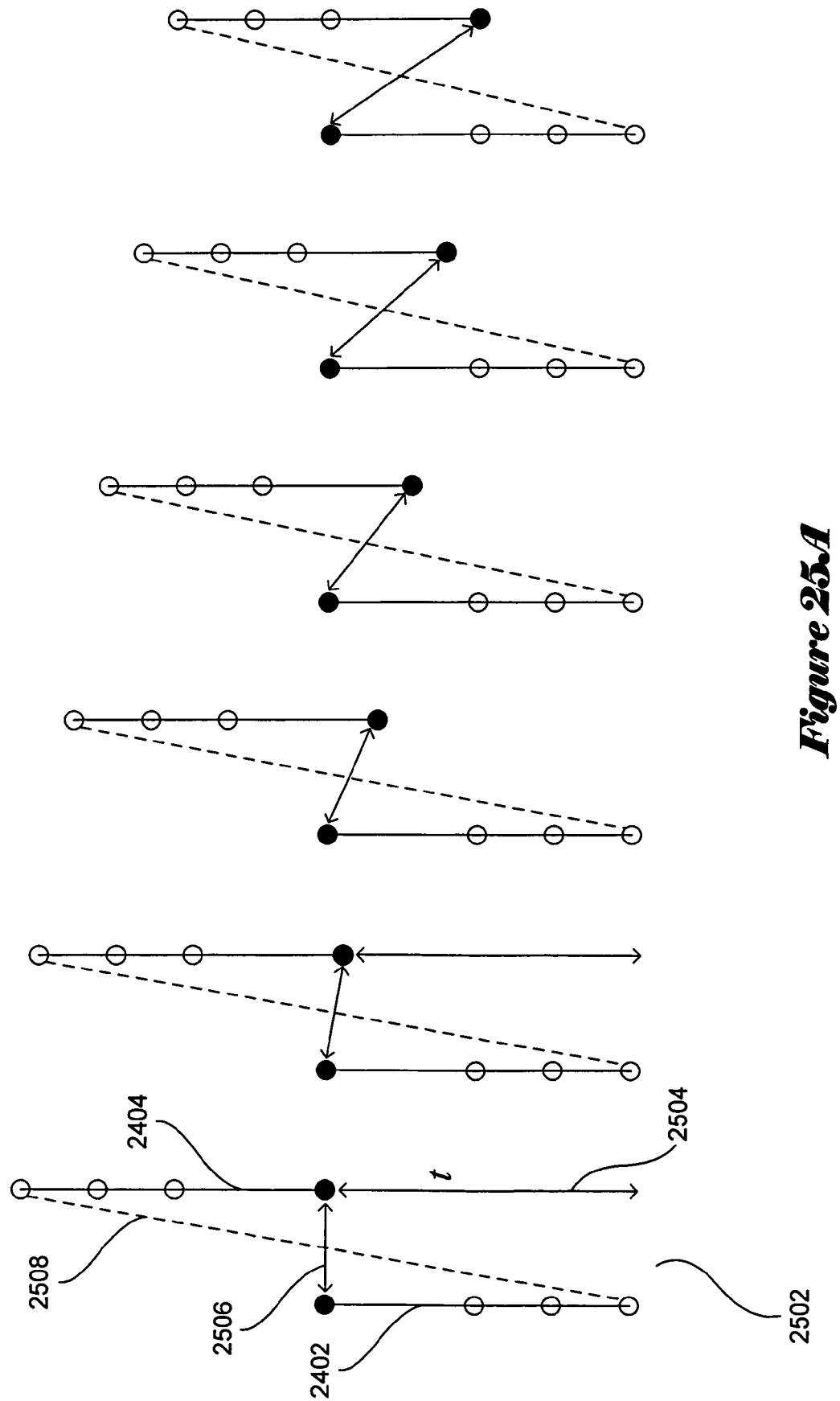
Figure 25B:
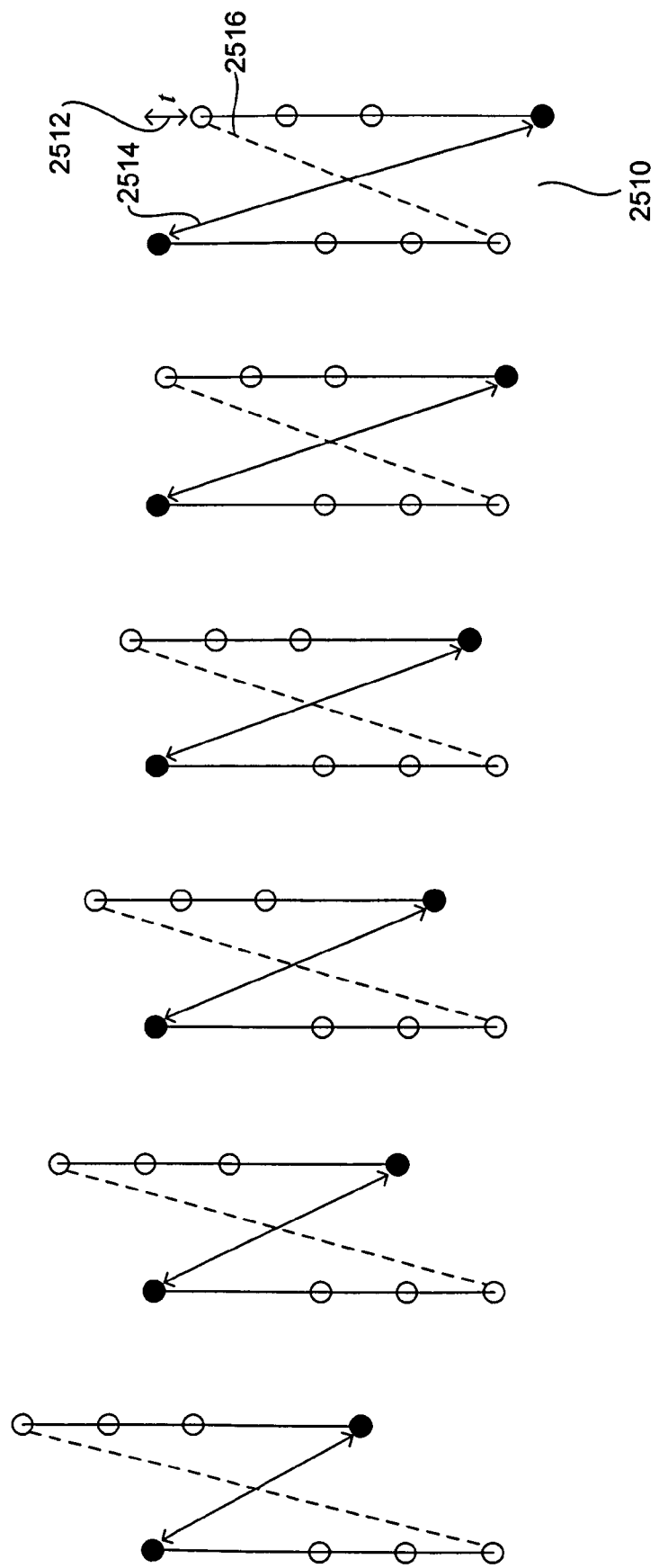
Figure 25C:
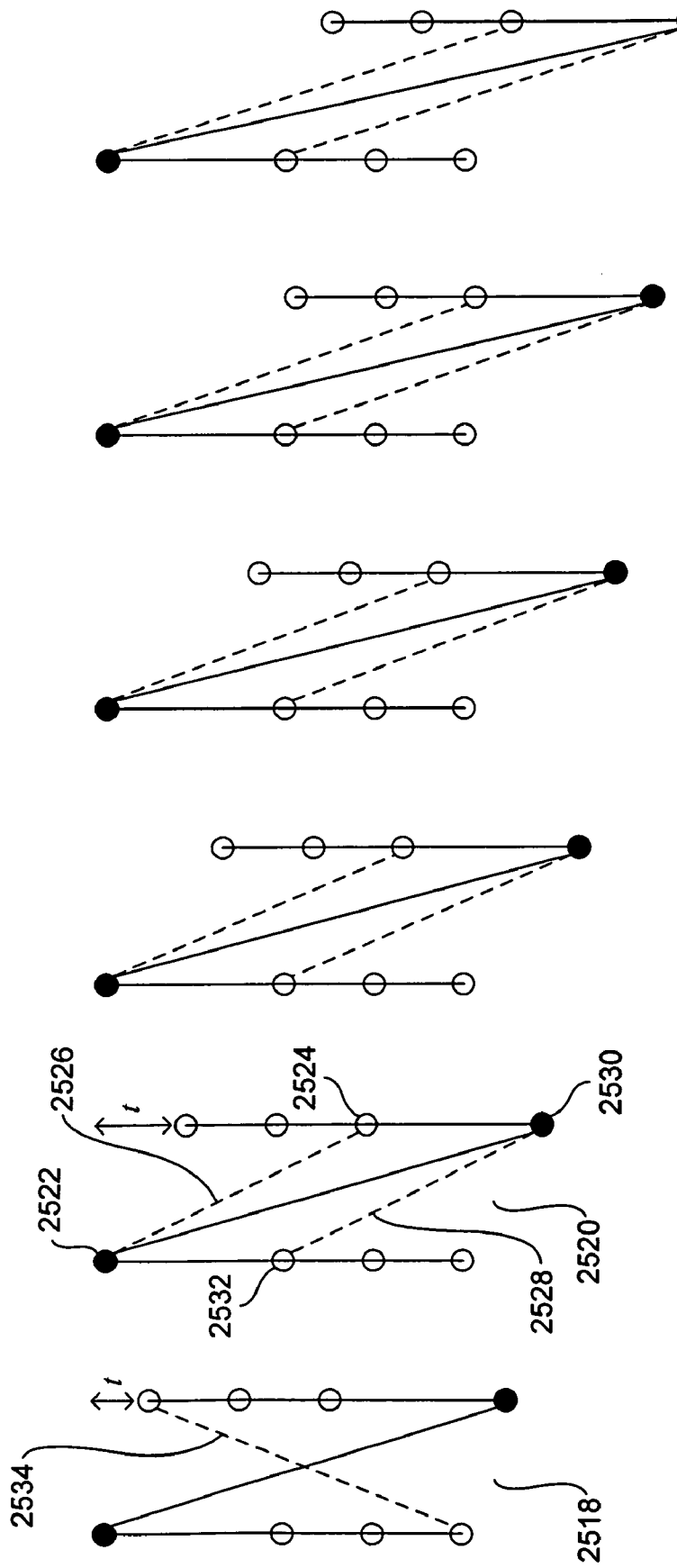

As the voltage offset t continues to increase as the diagrams in FIGS. 25C and D are traversed left-to-right, both the voltage dropped across the selected nanowire-crossbar junction and the voltage dropped across the largest-voltage non-selected nanowire-crossbar junction continue to increase, while the ratio $q_v$ increases, and approaches one as the offset voltage t increases towards infinity. This is easily seen in FIGS. 25A-D as the parallelogram with top and bottom sides equal to the two dashed lines 2526 and 2528, in diagram 2520, is stretched further and further downward, and narrows, as the voltage offset t continues to increase. In the limit, the length of the body diagonal of the parallelogram, connecting the two selected-nanowire voltage states, and the lengths of the dashed-line sides of the parallelogram approach equality, and the voltage margin $v_m$ approaches 0.

Figure 26:
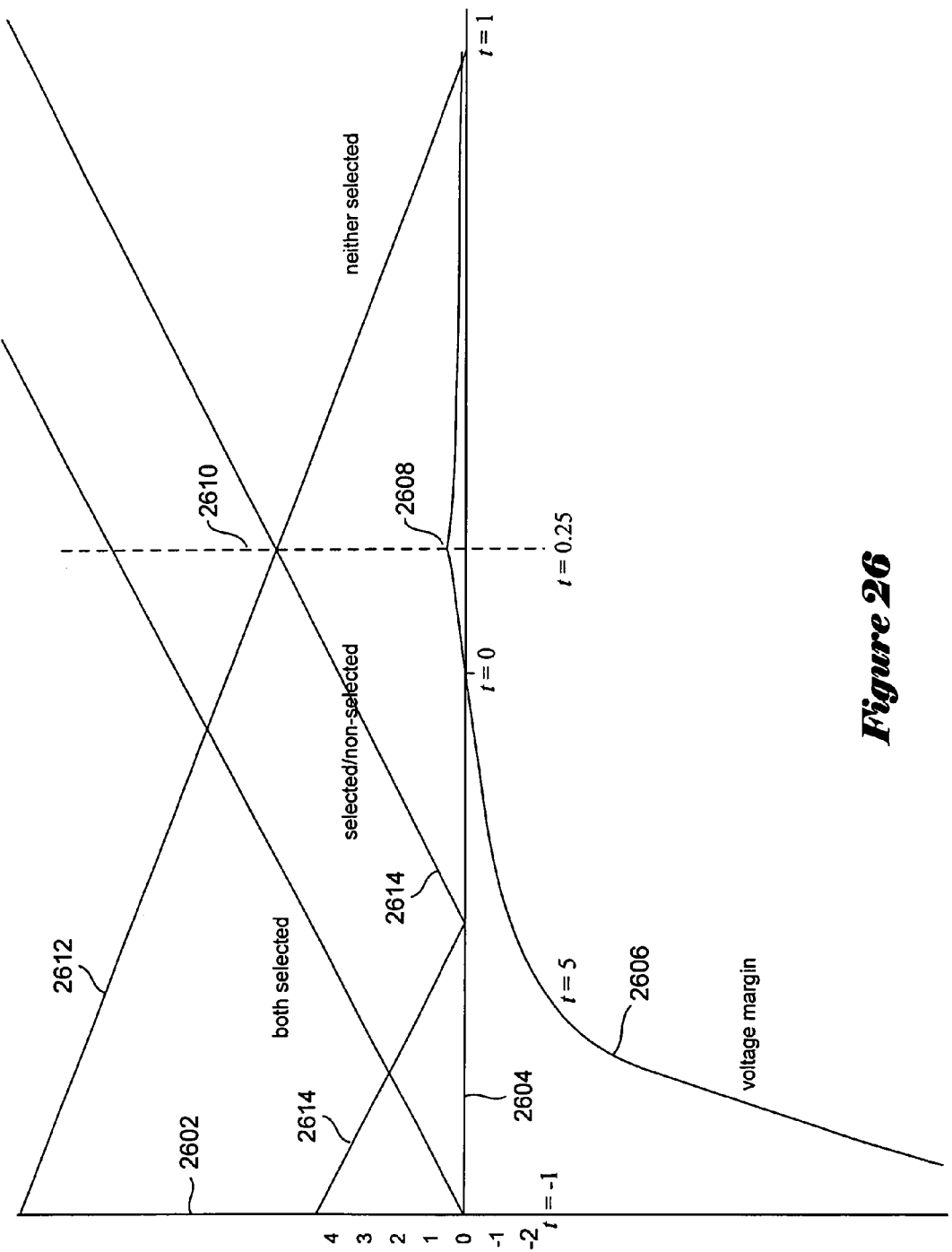
FIG. 26 plots the voltage margin curve and voltage separation curves for the example of FIGS. 25A-D.

FIG. 26 plots the voltage-margin curve and voltage separation curves for the example of FIGS. 25A-D. The vertical axis 2602 is incremented in normalized volts and the horizontal axis is incremented in voltage offsets t. The voltage-margin curve 2606 rises to an optimal point 2608 at t=0.25, at the voltage offset value t where the crossover 2610 from one non-selected nanowire-crossbar-junction voltage curve 2612 to another non-selected nanowire-crossbar-junction voltage curve 2614 occurs. The first non-selected nanowire-crossbar-junction voltage curve 2612 corresponds to the difference in voltage states interconnected by dashed line 2508 in FIG. 25A, and the second non-selected nanowire-crossbar-junction voltage curve 2614 corresponds to the difference in voltage states interconnected by dashed lines 2526 and 2528 in FIG. 25C.

Figure 27:
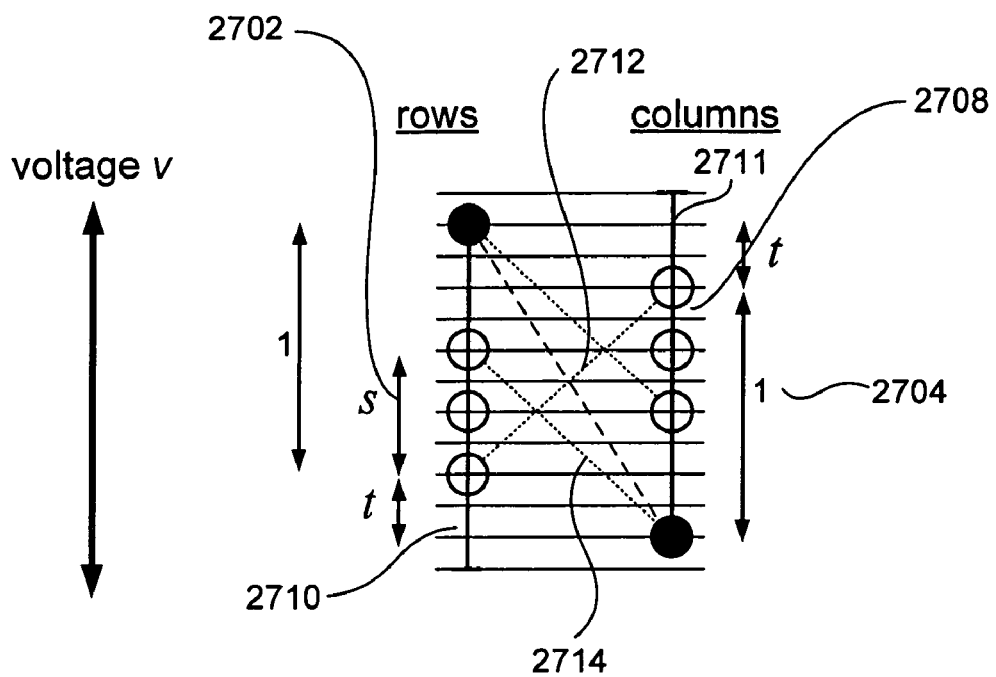
FIG. 27 shows a simple, geometric construction for determining the optimal voltage offset t for the two constant-weight-code-based encoder-demultiplexers of FIGS. 24 and 25A-D.

FIG. 27 shows a simple, geometric construction for determining the optimal voltage offset t for the two constant-weight-code-based encoder-demultiplexers of FIGS. 24 and 25A-D. FIG. 27 uses essentially the same illustration conventions as used in FIGS. 24 and 25A-D. In FIG. 27, the voltage difference s 2702 represents the splay, or width of the voltage interval from the lowest-voltage non-selected nanowire to the highest-voltage non-selected nanowire controlled by the first encoder-demultiplexer. The optimal voltage offset t occurs when the voltage states interconnected by dotted line 2712 are separated by the same voltage difference as the voltage states interconnected by dotted line 2714. This is because, as seen in FIG. 26, the optimal voltage offset t occurs at the crossover point 2610 between the two different non-selected nanowire-crossbar-junction voltage curves 2612 and 2614. The splay s is, of course, dependent on the particular constant-weight code used by the encoder-demultiplexers. To compute the splay s with respect to the re-normalized voltage interval, one can first compute the splay as the difference in normalized voltage between the voltage state corresponding to a difference between u and v of $d_{min}$ and the voltage state corresponding to a difference between u and v of $d_{max}$ as:

$$\left(1 - \frac{d_{min}}{2w}\right) - \left(1 - \frac{d_{max}}{2w}\right)$$

and then multiply the normalized voltage difference between the two states by the scale constant for scaling from the normalized voltages, $$\frac{2w}{d_{max}},$$

to obtain:

$$s = \frac{2w}{d_{max}} \left( \left(1 - \frac{d_{min}}{2w}\right) - \left(1 - \frac{d_{max}}{2w}\right) \right)$$

Simplifying, one obtains:

$$s = 1 - \frac{d_{min}}{d_{max}}$$

which can be expressed as:

$$s = 1 - \frac{1}{q_d}$$

where $$q_d = \frac{d_{max}}{d_{min}}$$

Note that, in FIG. 27, the possible voltage-output vectors are re-normalized, so that the voltage interval 2704 between the voltage state of the selected nanowire and the non-selected nanowire of greatest distance, in voltage, from the selected nanowire is 1. The segments 2710-2711 at the ends of the two possible voltage-output vectors represents the voltage difference between the sink voltage of the encoder-demultiplexer and the first, non-selected-nanowire voltage state.

As can be seen in the construction shown in FIG. 27, the optimal voltage offset t occurs when:

$$1-t=t+s$$

Also, by inspection of the construction shown in FIG. 27, the optimal offset voltage t occurs when the voltage drop across the selected nanowire-crossbar junction is 1+t and the voltage drop across the non-selected, greatest-voltage-drop nanowire-crossbar junction is 1−t. The optimal t, in terms of $q_d$, is obtained by:

$$t = \frac{1-s}{2}$$

$$t = \frac{1-\left(1-\frac{1}{q_d}\right)}{2} = \frac{1}{2q_d}$$

The voltage ratio $q_v$ can then be computed as:

$$q_v = \frac{1-t}{1+t} = \frac{1-\frac{1}{2q_d}}{1+\frac{1}{2q_d}} = \frac{2q_d - 1}{2q_d + 1}$$

which implies the optimal voltage margin is:

$$v_m = \frac{2t}{1+t} = 1 - q_v$$

Although the voltage margin of a device in terms of absolute voltage depends on both the voltage offset t and the source and sink voltages for the two encoder-demultiplexers. However, the optimal voltage margin can be seen in the above expression to depend on the characteristics of the constant-weight code employed in the addressing scheme implemented by the encoder-demultiplexers, regardless of the voltage offset t and the source and sink voltages for the two encoder-demultiplexers. To minimize $q_v$ and therefore maximize $v_m$, the ratio $$q_d = \frac{d_{max}}{d_{min}}$$

needs to be minimized, or to be as close to 1 as possible, which means that the splay s for constant-weight codes used in the nanoscale memory arrays with optimal voltage margins needs to be as low as possible.

However, minimizing $q_d$ is only one facet of choosing the best possible constant-weight code. Another consideration is that the number of microscale output signal lines in the microscale/nanoscale demultiplexer crossbar is n, the length, in bits, of code words of the constant-weight code. Thus, optimal constant-weight codes not only need low $q_d$ values, but also need low values of n. Of course, n needs also to be at least as large as $\log_2$ of one dimension M of the nanowire-crossbar memory array. Moreover, the chip area needed for the encoder-demultiplexer is proportional to nM, the area of the mixed scale nanowire crossbar. Thus, the product nM needs also to be minimized in selecting a best constant-weight code for implementing the encoder-demultiplexers of a nanoscale memory array.

Table 2, below, shows mathematically-proven lower bounds for $q_d$ for various ranges of n:

TABLE 2

| Lower Bound | |
|---|---|
| Range of n | $q_d$ |
| 8 | 4 |
| [9, 10] | 3 |
| [11, 14] | 2 |
| [15, 18] | 5/3 |
| [19, 23] | 3/2 |
| [24, 28] | 7/5 |
| [29, 32] | 4/3 |

In other words, minimum $q_d$ values for any constant-weight code with a given code-word size can be determined, and a constant-weight code with code-word size n having the computed lower-bound $q_d$ is optimal, for use in encoder-demultiplexers for memory arrays.

Some particular optimal constant-weight codes are shown in Table 3, below:

TABLE 3

Known Constant-Weight Codes With Low $q_d$

| Code | $d_{max}$ | $d_{min}$ | $q_d$ | n | $q_v$ | $v_m$ |
|---|---|---|---|---|---|---|
| (8, 70, 2, 4) | 8 | 2 | 4 | 8 | 7/9 | 2/9 ≅ 0.222 |
| (9, 84, 2, 3) | 6 | 2 | 3 | 9 | 5/7 | 2/7 ≅ 0.286 |
| (11, 66, 4, 5) | 8 | 4 | 2 | 11 | 3/5 | 2/5 = 0.400 |
| (15, 70, 6, 6) | 10 | 6 | 5/3 | 15 | 7/13 | 6/13 ≅ 0.462 |
| (20, 64, 8, 8) | 12 | 8 | 3/2 | 20 | 1/2 | 1/2 = 0.500 |
| | | | | | 9/19 | 10/19 ≅ 0.526 |
| | | | | | 5/11 | 6/11 ≅ 0.546 |

These constant-weight codes can be contrasted with known balanced linear codes previously determined to provide best encoder-multiplexer implementations, shown below in Table 4:

TABLE 4

| Base Code | Known Balanced Linear Codes With Best Performance | | | | | | |
|---|---|---|---|---|---|---|---|
| Linear Code | Balanced Linear Code | $d_{max}$ | $d_{min}$ | $q_d$ | N | $q_v$ | $v_m$ |
| [6, 6, 1] | (12, 64, 2, 6) | 12 | 2 | 6 | 12 | 11/13 | 2/13 ≅ 0.153 |
| [7, 6, 2] | (14, 64, 4, 7) | 12 | 4 | 3 | 14 | 5/7 | 2/7 ≅ 0.286 |
| [10, 6, 3] | (20, 64, 6, 10) | 16 | 6 | 8/3 | 20 | 13/19 | 6/19 ≅ 0.316 |
| [11, 6, 4] | (22, 64, 8, 11) | 16 | 8 | 2 | 22 | 3/5 | 2/5 = 0.400 |
| [14, 6, 5] | (28, 64, 10, 14) | 20 | 10 | 2 | 28 | 3/5 | 2/5 = 0.400 |
| [15, 6, 6] | (30, 64, 12, 15) | 20 | 12 | 5/3 | 30 | 7/13 | 6/13 ≅ 0.462 |
| [18, 6, 8] | (36, 64, 16, 18) | 24 | 16 | 3/2 | 36 | 1/2 | 1/2 = 0.500 |

Comparison of the parameters for the constant-weight codes shown in Table 3 and the balanced linear code shown in Table 4 reveals that, for a given voltage margin $v_m$, constant-weight code producing the given voltage margin $v_m$ have a significantly lower value of n than the best balanced linear code that provides essentially the same voltage margin. This comparison is shown below, in Table 5:

TABLE 5

| $v_m$ | n (Balanced Linear Code) | n (Constant-Weight Code) | Area Reduction Factor |
| --- | --- | --- | --- |
| $2/7 \cong 0.286$ | 14 | 9 | 0.642 |
| $2/5 = 0.400$ | 22 | 11 | 0.500 |
| $6/13 \cong 0.462$ | 30 | 15 | 0.500 |
| $1/2 = 0.500$ | 36 | 20 | 0.556 |

Because of the complexity of error-control-encoding code generation and the difficulty in characterizing these code spaces, a closed-form, analytical expression that would provide a measure of the relative merits of constant-weight codes versus balanced linear codes and other error-control codes for use in encoder-demultiplexer implementations is not currently available. However, it is well known that the code space of constant-weight codes is much larger than the code space of balanced linear codes. In other words, for a given set of constraints, such as a minimum M or a maximum $q_v$ ratio, there are more constant-weight codes than balanced linear codes. For this reason, it is probable that a more optimal constant-weight code can always be found for a given encoder-demultiplexer design problem.

There are no convenient matrix generators and linear expressions for generating and characterizing constant-weight codes. As a result, the logic needed for a constant-weight-code-based encoder may be significantly more complex than the logic needed for a balanced-linear-code-based encoder. However, techniques may be employed to ameliorate the complexity of constant-weight-code generation, including using algorithmic code generation rather than code tables implemented in logic. In large, tiled memories, such as the memory shown in FIG. 1, the cost in circuitry and complexity of a constant-weight-code-based encoder may be amortized over many individual nanoscale memory arrays.

Although these assumptions used in the above derivation of optimization criteria for constant-weight codes used for implementing encoder-demultiplexers depends on the many, above-discussed assumptions, and although these assumptions are likely not to hold for actual devices, the described devices represent an ideal case for which optimization criteria can be straightforwardly derived. It is believed by researchers in molecular electronics that these optimization criteria can be extrapolated to apply to non-ideal, real systems, much like equations derived in physics for ideal and simply-specified systems may nonetheless be applied, even if approximately, to more complex, real situations.

Although the present invention has been described in terms of particular embodiments, it is not intended that the invention be limited to this embodiment. Modifications within the spirit of the invention will be apparent to those skilled in the art. For example, for any given, real application, the various optimizing criteria for a selected constant-weight code on which to base the encoder-demultiplexers may vary. For example, in certain applications, it may be more important to minimize $q_d$ than it is to minimize n or nM. Furthermore, in real systems, the complexities and non-uniformities of the systems may prohibit a rigorous, quantitative analysis that would specify exactly those parameters of a constant-weight code to minimize or maximize to give an optimal constant-weight code for the particular application. Nonetheless, all current analysis and available evidence would suggest that, in general, constant-weight codes are optimal error-control encoding codes on which to base encoder-demultiplexers and nanoscale memory-array addressing schemes, and choosing, from among constant-weight codes with appropriate n and M values for a design problem, the constant-weight code or codes with minimum $q_d$ values will provide optimal constant-weight code for the design problem. Although, in the described embodiments, the encoder-demultiplexers employed the same constant-weight code, in alternative embodiments, the encoder-demultiplexers may employ different constant-weight codes with different values of n and M, and may differ in additional parameters. Although the described embodiments are nanoscale memory arrays, the constant-weight-code-based encoder-demultiplexers of the present invention may be employed in any of an almost limitless number of different nanoscale and mixed nanoscale/microscale electronic devices for addressing signal lines. For example, a single encoder-demultiplexer can be used to address nanoscale linear-serial latch arrays. Furthermore, while the described nanoscale memory embodiments employ hysteretic resistor junctions, the constant-weight-code-based encoder-demultiplexers of the present invention may be effectively employed for addressing devices based on nanowire-crossbars having diode or diode-like nanowire junctions, or nanowire junctions with characteristics analogous to other types of familiar electronic devices. While the described embodiments concerned nanoscale and mixed nanoscale/microscale devices, the properties of constant-weight codes identified as being favorable for the described embodiments may also be useful in pure microscale devices, and other device. Although, in the described embodiments, each addressed nanowire has a unique internal address corresponding to a codeword of a constant-weight code, in alternative embodiments, two or more nanowires may share a particular constant-weight-code address, and may be simultaneously selected. Although the described embodiments all use voltage signals, current signals and other types of signals may be employed in alternative embodiments. While the distinguished signals output to selected nanowires are higher-voltage signals than the signals output to non-selected nanowires, in the encoder-demultiplexer embodiments discussed above, in alternative embodiments, the distinguished signals may have a smaller magnitude than those output to non-selected nanowires.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An encoder-demultiplexer comprising:
    k input signal lines;
    an encoder that generates an n-bit-constant-weight-code-codeword internal address for each different external address received on the k input signal lines;
    n output signal lines on which an n-bit-constant-weight-code-codeword internal address is output by the encoder; and a number of encoder-demultiplexer-addressed signal lines interconnected with the n output signal lines, the encoder-demultiplexer-addressed signal lines each associated with an n-bit-constant-weight-code-codeword internal address.

2. The encoder-demultiplexer of claim 1 wherein the n output signal lines are selectively interconnected with the encoder-demultiplexer-addressed signal lines so that, when the encoder outputs a particular n-bit-constant-weight-code-codeword internal address to the n output signal lines, a signal is input to an encoder-demultiplexer-addressed signal line associated with the n-bit-constant-weight-code-codeword internal address that is distinguishable from signals input to all encoder-demultiplexer-addressed signal lines not associated with the n-bit-constant-weight-code-codeword internal address.

3. The encoder-demultiplexer of claim 1 wherein the signal input to the encoder-demultiplexer-addressed signal line associated with the n-bit-constant-weight-code-codeword internal address that is distinguishable from signals input to all encoder-demultiplexer-addressed signal lines not associated with the n-bit-constant-weight-code-codeword internal address is a voltage signal of greater magnitude than voltage signals output to all encoder-demultiplexer-addressed signal lines not associated with the n-bit-constant-weight-code-codeword internal address.

4. The encoder-demultiplexer of claim 1 wherein the signal input to the addressed signal line associated with the n-bit-constant-weight-code-codeword internal address that is distinguishable from signals input to all addressed signal lines not associated with the n-bit-constant-weight-code-codeword internal address is a voltage signal of smaller magnitude than voltage signals output to all addressed signal lines not associated with the n-bit-constant-weight-code-codeword internal address.

5. The encoder-demultiplexer of claim 1 wherein the signal input to the addressed signal line associated with the n-bit-constant-weight-code-codeword internal address that is distinguishable from signals input to all encoder-demultiplexer-addressed signal lines not associated with the n-bit-constant-weight-code-codeword internal address is a current signal of greater magnitude than voltage signals output to all encoder-demultiplexer-addressed signal lines not associated with the n-bit-constant-weight-code-codeword internal address.

6. The encoder-demultiplexer of claim 1 wherein the signal input to the encoder-demultiplexer-addressed signal line associated with the n-bit-constant-weight-code-codeword internal address that is distinguishable from signals input to all encoder-demultiplexer-addressed signal lines not associated with the n-bit-constant-weight-code-codeword internal address is a current signal of smaller magnitude than voltage signals output to all encoder-demultiplexer-addressed signal lines not associated with the n-bit-constant-weight-code-codeword internal address.

7. The encoder-demultiplexer of claim 1 wherein the k input signal lines and the n output signal lines are microscale signal lines, the encoder is implemented in microscale or submicroscale logic, and the number of encoder-demultiplexer-addressed signal lines are nanowires.

8. The encoder-demultiplexer of claim 1 that, along with a second encoder-demultiplexer, addresses nanowire-crossbar junctions in a nanowire crossbar.

9. The encoder-demultiplexer of claim 1 that addresses linearly ordered nanoscale components of a nanoscale or mixed-scale device.

10. The encoder-demultiplexer of claim 1 that, along with a additional encoder-demultiplexers, addresses nanoscale components of a nanoscale or mixed-scale device arranged in 3 or more logical dimensions.

11. The encoder-demultiplexer of claim 1 wherein the constant-weight code has a minimal $q_d$ ratio for the size M of the constant-weight code, where the $q_d$ ratio is a ratio of the maximum distance between different codewords and the minimum distance between codewords of the constant-weight code, wherein k equal to ceiling(M), and wherein the number of encoder-demultiplexer-addressed signal lines is less than or equal to M.

12. A nanoscale memory array comprising:
a nanowire crossbar with a first set of i parallel nanowires and a second set of j parallel nanowires, the nanowires of the first and second sets of nanowires not parallel to one another, and therefore forming a grid with points of closest contact between each nanowire of the first set of parallel nanowires and each nanowire of the second set of parallel nanowires forming nanowire junctions;
a first encoder-demultiplexer that controls voltages on the first set of parallel nanowires by outputting voltage patterns equivalent to codewords of a constant-weight code with size $M \geq i$; and
a second encoder-demultiplexer that controls voltages on the second set of parallel nanowires by outputting voltage patterns equivalent to codewords of a constant-weight code with size $M \geq j$.

13. The nanoscale memory array of claim 12 wherein the nanowire junctions operate as hysteretic resistors with well defined WRITE-access thresholds and destruction thresholds.

14. The nanoscale memory array of claim 12 wherein each of the first and second encoder-demultiplexers outputs voltage patterns equivalent to codewords of a constant-weight code onto microscale output signal lines selectively interconnected to the set of parallel nanowires controlled by the first and second encoder-demultiplexers so that, for each output codeword, a selected nanowire with an internal nanowire address equal to the codeword is placed in a voltage state closest to the source voltage of the encoder-demultiplexer, and all non-selected nanowires are placed in voltage states further from the source voltage than the selected nanowire.

15. The nanoscale memory array of claim 14 wherein a nanowire junction between nanowires currently selected by the two encoder-demultiplexers is selected, and all other nanowire junctions are not selected.

16. The nanoscale memory array of claim 15 wherein the constant-weight codes provide sufficient voltage separations between a selected nanowire and non-selected nanowires to ensure that a voltage of magnitude greater than the WRITE-access threshold but less than the destruction thereshold is dropped across the selected nanowire junction, while voltages less than the WRITE-access threshold are dropped across the non-selected nanowire junctions.

17. The nanoscale memory array of claim 16 wherein the constant-weight codes provide $q_v$ ratios, where $q_v$ is the ratio between a voltage of greatest magnitude output to a non-selected nanowire to the magnitude of a voltage output to the selected nanowire, sufficient to provide a specified voltage margin between the magnitude of the voltage dropped across the selected nanowire junction and the magnitude of the voltage dropped across a non-selected nanowire junction closest to the magnitude of the voltage dropped across the selected nanowire junction.

18. The nanoscale memory array of claim 17 wherein the constant-weight codes have $q_d$ ratios, where the $q_d$ ratio is the ratio of the maximum distance between different codewords and the minimum distance between codewords, sufficient to provide the $q_v$ ratios.

19. A method for addressing a number of signal lines, the method comprising:
   determining a number of signal lines i that need to be addressed;
   determining a signal margin needed between a signal output to a selected, addressed signal line and any signal output to a non-selected, addressed signal line; and
   implementing a constant-weight-code-based encoder-demultiplexer to address the number of signal lines.

20. The method of claim 19 wherein the constant-weight code has a minimal $q_d$ ratio for the size M of the constant-weight code, where the $q_d$ ratio is a ratio of the maximum distance between different codewords and the minimum distance between codewords of the constant-weight code, and i≦M.

21. The method of claim 19 wherein the constant-weight code is one of the constant-weight codes:
   (8,70,2,4);
   (9,84,2,3);
   (11,66,4,5);
   (15,70,6,6); and
   (20,64,8,8).

22. The method of claim 19 wherein the signals are voltages.

23. The method of claim 19 the encoder-demultiplexer comprises:
   k input signal lines;
   an encoder that generates an n-bit-constant-weight-code-codeword internal address for each different external address received on the k input signal lines; and
   n output signal lines, on which an n-bit-constant-weight-code-codeword internal address is output by the encoder, interconnected with the i signal lines, the i signal lines each associated with an n-bit-constant-weight-code-codeword internal address.

* * * * *

UNITED STATES PATENT AND TRADEMARK OFFICE
CERTIFICATE OF CORRECTION

PATENT NO. : 7,489,583 B2
APPLICATION NO. : 11/221036
DATED : February 10, 2009
INVENTOR(S) : Philip J. Kuekes et al.

It is certified that error appears in the above-identified patent and that said Letters Patent is hereby corrected as shown below:

On the face page, in field (73), in "Assignee", in column 1, line 2, after "L.P." insert -- , Houston, TX (US) --.

In column 17, line 12, delete " $d_{u_a\ b}^{-u}$ " and insert -- $d_{u_a-u_b}$ --, therefor.

In column 21, lines 22-23, delete "endcoder-demultiplexers" and insert -- encoder-demultiplexers --, therefor.

In column 22, lines 11-13, delete " $\frac{V}{3} - \frac{V}{3}$ " and insert -- $\frac{V}{3} - \frac{V}{3}$ --, therefor.

In column 25, line 4, delete "=w(uXOR=h)" and insert -- =w(u XOR h) --, therefor.

In column 36, line 52, in Claim 16, delete "thereshold" and insert -- threshold --, therefor.

Signed and Sealed this

Twenty-first Day of July, 2009

JOHN DOLL
*Acting Director of the United States Patent and Trademark Office*